(12) United States Patent
Naoi

(10) Patent No.: US 8,043,800 B2
(45) Date of Patent: *Oct. 25, 2011

(54) PHOTOSENSITIVE MATERIAL FOR FORMING CONDUCTIVE FILM, AND CONDUCTIVE MATERIAL

(75) Inventor: Kenji Naoi, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/885,273

(22) Filed: Sep. 17, 2010

(65) Prior Publication Data
US 2011/0070404 A1    Mar. 24, 2011

(30) Foreign Application Priority Data
Sep. 18, 2009    (JP) ................. 2009-217372

(51) Int. Cl.
G03C 1/005    (2006.01)
G03C 1/494    (2006.01)
G03C 1/00    (2006.01)
G03C 5/00    (2006.01)

(52) U.S. Cl. ........ 430/564; 430/311; 430/321; 430/331; 430/496; 430/567; 430/620; 430/627; 430/642; 427/58

(58) Field of Classification Search ............... 430/564, 430/311, 321, 331, 496, 567, 620, 627, 642; 427/58
See application file for complete search history.

(56) References Cited

U.S. PATENT DOCUMENTS

2006/0257638 A1* 11/2006 Glatkowski et al. ....... 428/292.1
2007/0074316 A1    3/2007 Alden et al.
2009/0324902 A1* 12/2009 Tokunaga et al. .......... 428/195.1

FOREIGN PATENT DOCUMENTS
JP        2009-146747 A    7/2009

* cited by examiner

*Primary Examiner* — Geraldina Visconti
(74) *Attorney, Agent, or Firm* — Sughrue Mion, PLLC

(57) ABSTRACT

A photosensitive material for forming a conductive film including a silver salt-containing emulsion layer, and a conductive layer containing conductive fibers, wherein the amount of the conductive fibers in the conductive layer is 0.005 g/m$^2$ to 0.2 g/m$^2$.

15 Claims, 2 Drawing Sheets

PHOTOSENSITIVE MATERIAL FOR FORMING CONDUCTIVE FILM, AND CONDUCTIVE MATERIAL

BACKGROUND OF THE INVENTION

1. Field of the Invention

The present invention relates to a photosensitive material for forming a conductive film and a conductive material using the photosensitive material. Specifically, the present invention relates to a photosensitive material for forming a conductive film, in which conductive fibers are contained in any layer, and a conductive material using the photosensitive material.

2. Description of the Related Art

Recently, conductive films produced by various production methods have been studied. For example, there is a conductive film in a silver halide system, which is produced by applying a silver halide emulsion, and exposing patternwise so as to form a conductive film having a conductive region of silver for conductivity and an opening region for securing transparency. Moreover, a method of using a metal oxide such as ITO in combination, so as to supply electricity to an entire film surface has been proposed. However, since such conductive films are generally formed by vacuum deposition methods, such as vapor deposition, sputtering, ion plating, there is a problem such that the production cost thereof is high.

In view of such problem, a method of applying ITO fine particles so as to reduce production cost is proposed. However, in order to decrease resistance, it is necessary to apply a large amount of fine particles having conductivity. As a result, transmittance is decreased. Thus, the fundamental problem has not been solved (Japanese Patent Application Laid-Open (JP-A) No. 2009-146747).

Moreover, recently, a transparent conductive film using a silver nanowire has been studied and reported (U.S. Patent Application Publication No. 2007/74316). The transparent conductive film using a silver nanowire is excellent in terms of transparency, resistance, and a reduced amount of metal used. However, it is generally synthesized at high temperature using an organic solvent, and there are problems of high cost caused by production scale, and environmental problem by using the organic solvent. Moreover, because the material having conductivity is used in small amount, electromigration occurs by using the material in a current driving element.

BRIEF SUMMARY OF THE INVENTION

The present invention is aimed to provide a conductive material having high transparency and conductivity, highly inhibited (or extremely low) haze, adhesion and flexibility, and a photosensitive material for forming a conductive film for producing the conductive material.

The inventors of the present invention have studied intensively to achieve the object and found that the conductivity of the conductive material can be increased by adding conductive fibers either in a silver salt-containing emulsion layer or any layer adjacent to the silver salt-containing emulsion layer, and that the conductive material can be advantageously used as a surface electrode.

Namely, the inventors of the present invention found that the above problems are solved by producing a conductive material in such a manner that conductive fibers and a binder are contained in any layer of a photosensitive material, followed by exposing and developing. Thus, the present invention has been completed.

<1> A photosensitive material for forming a conductive film including: a silver salt-containing emulsion layer; and a conductive layer containing conductive fibers, wherein the amount of the conductive fibers in the conductive layer is 0.005 g/m$^2$ to 0.2 g/m$^2$.

<2> The photosensitive material for forming a conductive film including a silver salt-containing emulsion layer containing conductive fibers, wherein the amount of the silver salt in the silver salt-containing emulsion layer is 1.0 g/m$^2$ to 7.5 g/m$^2$ based on silver.

<3> The photosensitive material for forming a conductive film according to <1>, wherein the amount of the silver salt in the silver salt-containing emulsion layer is 1.0 g/m$^2$ to 7.5 g/m$^2$ based on silver.

<4> The photosensitive material for forming a conductive film according to <1>, wherein a material for forming the conductive fibers is any one of a metal and carbon.

<5> The photosensitive material for forming a conductive film according to <1>, wherein the silver salt-containing emulsion layer and the conductive layer are formed by simultaneously applying coating solutions thereof.

<6> The photosensitive material for forming a conductive film according to <1>, wherein the conductive fibers are metal nanowires each having a minor axis length of 8 nm to 50 nm, and a major axis length of 1 μm to 40 μm.

<7> The photosensitive material for forming a conductive film according to <6>, wherein the metal nanowires are each formed of silver or a mixture of silver and one or more metals other than the silver.

<8> The photosensitive material for forming a conductive film according to <1>, wherein the conductive fibers are carbon nanotubes each having a minor axis length of 1 nm to 1,000 nm, and a major axis length of 0.1 μm to 1,000 μm.

<9> The photosensitive material for forming a conductive film according to <2>, wherein a material for forming the conductive fibers is any one of a metal and carbon.

<10> The photosensitive material for forming a conductive film according to <2>, wherein the amount of the conductive fibers in the silver salt-containing emulsion layer is 0.005 g/m$^2$ to 0.2 g/m$^2$.

<11> The photosensitive material for forming a conductive film according to <2>, wherein the conductive fibers are metal nanowires each having a minor axis length of 8 nm to 50 nm, and a major axis length of 1 μm to 40 μm.

<12> The photosensitive material for forming a conductive film according to <11>, wherein the metal nanowires are each formed of silver or a mixture of silver and one or more metals other than the silver.

<13> The photosensitive material for forming a conductive film according to <2>, wherein the conductive fibers are carbon nanotubes each having a minor axis length of 1 nm to 1,000 nm, and a major axis length of 0.1 μm to 1,000 μm.

<14> A conductive material, including a patterned photosensitive material for forming a conductive film, obtained by exposing a photosensitive material patternwise and developing the exposed photosensitive material, wherein the photosensitive material is either (1) a photosensitive material for forming a conductive film containing a silver salt-containing emulsion layer, and a conductive layer containing conductive fibers, wherein the amount of the conductive fibers in the conductive layer is 0.005 g/m$^2$ to 0.2 g/m$^2$, or (2) a photosensitive material for forming a conductive film containing a silver salt-containing emulsion layer containing conductive fibers, wherein the amount of the silver salt in the silver salt-containing emulsion layer is 1.0 g/m$^2$ to 7.5 g/m$^2$ based on silver.

<15> The conductive material according to <14>, further containing metal silver.
<16> The conductive material according to <14>, wherein a material for forming the conductive fibers is any one of a metal and carbon.
<17> The conductive material according to <14>, wherein the photosensitive material is (1) the photosensitive material, and the silver salt-containing emulsion layer and the conductive layer are formed by simultaneously applying coating solutions thereof.
<18> The conductive material according to <14>, wherein the conductive fibers are metal nanowires each having a minor axis length of 8 nm to 50 nm and a major axis length of 1 μm to 40 μm.
<19> The conductive material according to <18>, wherein the metal nanowires are each formed of silver or a mixture of silver and one or more metals other than the silver.
<20> The conductive material according to <14>, wherein the conductive fibers are carbon nanotubes each having a minor axis length of 1 nm to 1,000 nm and a major axis length of 0.1 μm to 1,000 μm.
<21> A display element containing a conductive material which includes a patterned photosensitive material for forming a conductive film, obtained by exposing a photosensitive material patternwise and developing the exposed photosensitive material, wherein the photosensitive material for forming a conductive film includes a silver salt-containing emulsion layer, and a conductive layer containing conductive fibers, wherein the amount of the conductive fibers in the conductive layer is 0.005 g/m² to 0.2 g/m²
<22> A display element containing a conductive material which includes a patterned photosensitive material for forming a conductive film, obtained by exposing a photosensitive material patternwise and developing the exposed photosensitive material, wherein the photosensitive material for forming a conductive film includes a silver salt-containing emulsion layer containing conductive fibers, wherein the amount of the silver salt in the silver salt-containing emulsion layer is 1.0 g/m² to 7.5 g/m² based on silver.
<23> A solar battery containing a conductive material which includes a patterned photosensitive material for forming a conductive film, obtained by exposing a photosensitive material patternwise and developing the exposed photosensitive material, wherein the photosensitive material for forming a conductive film includes a silver salt-containing emulsion layer, and a conductive layer containing conductive fibers, wherein the amount of the conductive fibers in the conductive layer is 0.005 g/m² to 0.2 g/m²
<24> A solar battery containing a conductive material, including a patterned photosensitive material for forming a conductive film, obtained by exposing a photosensitive material patternwise and developing the exposed photosensitive material, wherein the photosensitive material for forming a conductive film includes a silver salt-containing emulsion layer containing conductive fibers, wherein the amount of the silver salt in the silver salt-containing emulsion layer is 1.0 g/m² to 7.5 g/m² based on silver.

The present invention enables to provide a conductive material having high transparency and conductivity, and highly inhibited (or extremely low) haze and adhesion and flexibility, and a photosensitive material for forming a conductive film for producing the conductive material.

DETAILED DESCRIPTION OF THE INVENTION

Figure 1:
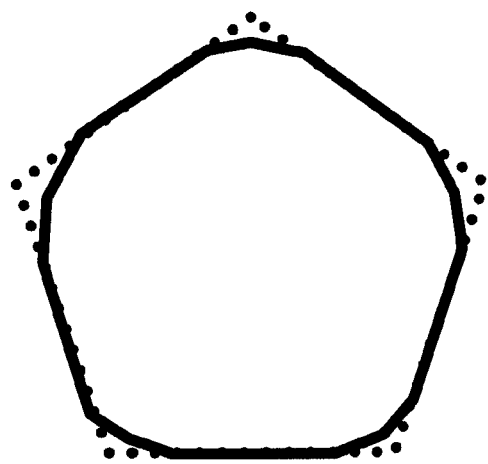
FIG. 1 is a cross sectional view showing an example of a metal nanowire.

Hereinafter, preferred embodiments of the present invention will be described. The description of the elements described below may be based on a typical embodiment of the present invention, but the present invention will not be limited to the embodiment. Note that in the specification numerical range expressed by using "to" means the numerical range including the numerical values before and after "to" respectively as a lower limit value and an upper limit value.

(Photosensitive Material for Forming Conductive Film)

An embodiment of a photosensitive material for forming a conductive film of the present invention includes a silver salt-containing emulsion layer containing conductive fibers, and other layers, as necessary. Another embodiment of the photosensitive material for forming a conductive film of the present invention includes a silver salt-containing emulsion layer and a conductive layer containing conductive fibers, and further includes other layers as necessary. Furthermore, the photosensitive material for forming a conductive film of the present invention may have the structure as described above on a support described below.

<Silver Salt-Containing Emulsion Layer>

The photosensitive material for forming a conductive film of the present invention includes an emulsion layer containing a silver salt emulsion (silver salt-containing emulsion layer). The silver salt-containing emulsion layer is not particularly limited, and may be appropriately selected depending on the intended purpose. The silver salt-containing emulsion layer may contain a binder, a solvent an additive such as a dye, in addition to the silver salt emulsion. Moreover, the silver salt-containing emulsion layer may contain conductive fibers described below. The thickness of the silver salt-containing emulsion layer is preferably 0.1 μm to 10 μm, and more preferably 0.1 μm to 5 μm.

In the photosensitive material for forming a conductive film, the silver salt-containing emulsion layer is substantially formed on the topmost layer. In the specification, "the silver salt-containing emulsion layer is substantially formed on the topmost layer" means not only a case where the silver salt-containing emulsion layer is actually formed as the topmost layer but also a case where the total thickness of one or more layers formed on the silver salt-containing emulsion layer is 0.5 μm or less. The total thickness of the layer(s) formed on the silver salt-containing emulsion layer is preferably 0.2 μm or less.

—Silver Salt Emulsion—

The silver salt emulsion used in the present invention is not particularly limited, and may be appropriately selected depending on the intended purpose, as long as it is a semiopaque liquid, which contains water as a medium and a silver salt described below. The silver salt is not particularly limited, and may be appropriately selected depending on the intended purpose. Examples thereof include an inorganic silver salt such as silver halide, and an organic silver salt such as silver acetate. In the present invention, it is preferred to employ silver halide having such excellent properties that remarkably accelerates reduction reaction by exposure at a certain wavelength. When conductive fibers and a binder are contained in the silver salt-containing emulsion layer, the coated amount of the silver salt is 1.0 g/m$^2$ to 7.5 g/m$^2$, preferably 1.5 g/m$^2$ to 6.5 g/m$^2$, more preferably 2.0 g/m$^2$ to 6.0 g/m$^2$, and particularly preferably 2.5 g/m$^2$ to 5.5 g/m$^2$, based on silver.

Moreover, in the case where a layer to which the conductive fibers and the binder are added (for example, a conductive layer or protective layer) is formed over a surface of the silver salt-containing emulsion layer, which surface is opposite to a support, or the layer to which the conductive fibers and the binder are added (for example, an undercoating layer) is formed over the other surface of the silver salt-containing emulsion layer, which surface is close to the support, the coated amount of the silver salt is not particularly limited, and may be appropriately selected depending on the intended purpose. It is preferably 1.0 g/m$^2$ to 7.5 g/m$^2$, more preferably 1.5 g/m$^2$ to 6.5 g/m$^2$, even more preferably 2.0 g/m$^2$ to 6.0 g/m$^2$, and particularly preferably 2.5 g/m$^2$ to 5.5 g/m$^2$. When the amount of the silver salt is too small, it is difficult to obtain sufficient conductivity. When the amount is too high, problems, such as decrease in transmittance may noticeably occur.

—Group VIII and VIIB Metals—

The silver salt emulsion may contain group VIII and VIIB metals in order to achieve high contrast and low fog. In particular, the silver salt emulsion preferably contains a rhodium compound, an iridium compound, a ruthenium compound, an iron compound, an osmium compound and the like. The compounds may be compounds having various kinds of ligands. Furthermore, in order to obtain higher sensitivity, a hexacyanated metal complex such as $K_4[Fe(CN)_6]$, $K_4[Ru(CN)_6]$ or $K_3[Cr(CN)_6]$ is advantageously doped.

—Rhodium Compound—

As the rhodium compound, a water-soluble rhodium compound can be used. Examples of the water-soluble rhodium compound include a rhodium (III) halide compound, a hexachloro rhodium (III) complex salt, a pentachloroaqua rhodium complex salt, a tetrachlorodiaqua rhodium complex salt, a hexabromo rhodium (III) complex salt, a hexamine rhodium (III) complex salt, a trioxalate rhodium (III) complex salt, and $K_3[Rh_2Br_9]$.

—Iridium Compound—

Examples of the iridium compound include a hexachloro iridium complex salt such as $K_2[IrCl_6]$, $K_3[IrCl_6]$ or the like, a hexabromo iridium complex salt, a hexaammine iridium complex salt, and a pentachloro nitrosyl iridium complex salt.

—Binder—

Examples of the binder include gelatin, carrageenan, polyvinyl alcohol (PVA), polyvinyl pyrrolidone (PVP), polysaccharides such as starch, celluloses and derivatives thereof, polyethylene oxide, polysaccharides, polyvinyl amine, chitosan, polylysine, polyacrylic acid, polyalginic acid, polyhyalulonic acid, carboxy cellulose, gum arabic, and sodium alginate. These may have neutral, negative ionicity or positive ionicity depending on the ionicity of a functional group.

The amount of the binder contained in the silver salt-containing emulsion layer is not particularly limited, and may be appropriately selected depending on the intended purpose, as long as the dispersibility and adhesion of the binder can be exerted. As for the amount of the silver salt and the binder in the silver salt-containing emulsion layer, the ratio by volume of Ag to the binder is preferably 1/10 or more, more preferably 1/4 or more, even more preferably 1/2 or more, and particularly preferably 1/1 or more. A large amount of the binder may cause decrease in the conductivity. Therefore, the amount of the binder is preferably small. The excessively large amount of Ag causes adhesion failure. The ratio by volume of Ag to the binder may be obtained by converting the ratio by mass of the silver halide to the binder in the starting material into the ratio by mass of Ag to the binder, and further converting this ratio by mass of Ag to the binder into the ratio by volume of Ag to the binder. The silver salt-containing emulsion layer may be composed of two or more layers having mutually the same or different amount of the silver salt.

Meanwhile, even in the case where the silver salt-containing emulsion layer does not contain the conductive fibers, the silver salt-containing emulsion layer preferably contains the binder as descried above, in order to uniformly disperse silver salt particles, and assist the adhesion between the silver salt-containing emulsion layer and a support.

—Solvent—

A solvent used to form the silver salt-containing emulsion layer is not particularly limited, and may be appropriately selected depending on the intended purpose. Examples thereof include water, an organic solvent (for example, as alcohols such as methanol, ketones such as acetone, amides such as formamide, sulfoxides such as dimethyl sulfoxide, esters such as ethyl acetate, and ethers), an ionic liquid and mixtures thereof.

An amount of the solvent used in the silver salt-containing emulsion layer is not particularly limited, and may be appropriately selected depending on the intended purpose. For example, the solvent is preferably 30% by mass to 90% by mass, and more preferably 50% by mass to 80% by mass, based on the total mass of the silver salt, binder, etc. contained in the silver salt-containing emulsion layer. When the solvent is less than 30% by mass, emulsion particles are precipitated and a coating amount of the solution increases due to decrease in the viscosity, which cause large process load, such as extended drying step. When the solvent is more than 90% by mass, particles easily aggregate over time, possibly causing severe problems such as uneven coating.

—Other Additives—

Additives used in the silver salt-containing emulsion layer are not particularly limited, and may be appropriately selected from known additives. Examples thereof include a dye, a thickener, an antioxidant, a matting agent, a lubricant, an antistatic agent, a nucleating agent, a sensitizing dye such as chemical sensitizing dye and a spectral sensitizing dye, a surfactant, an antifog agent, a hardener, and a black-spot inhibitor. A material having a high dielectric constant may be added. In order to make the surface hydrophobic, a hydrophobic group(s) may be introduced into the binder, or a hydrophobic compound may be added as an additive. These additives may be contained not only in the silver salt-containing emulsion layer, but also in other layers, which constitute the photosensitive material for forming a conductive film.

—Sensitization—

The photosensitive material for forming a conductive film of the present invention may be sensitized by various sensitizing methods. The sensitizing method is not particularly limited, and may be appropriately selected depending on the intended purpose. Examples thereof include the sensitizing methods using a chemical sensitizer, a spectral sensitizer or the like. In the chemical sensitization, a method such as chalcogen sensitization such as sulfur sensitization, selenium sensitization, tellurium sensitization or the like, noble metal sensitization such as gold sensitization or the like, reduction sensitization or the like can be used. These may be used alone or in a combination. When the methods of the chemical sensitizations are used in combination, for instance, a combination of sulfur sensitization and gold sensitization; a combination of sulfur sensitization, selenium sensitization and gold sensitization; and a combination of sulfur sensitization, tellurium sensitization and gold sensitization are preferable.

—Sulfur Sensitization—

A sulfur sensitizer used in the sulfur sensitization is not particularly limited and, may be appropriately selected depending on the intended purpose. For instance, various sulfur compounds such as thiosulfates, thioureas, thiazoles, rhodanines or the like can be used. A thiosulfate compound, a thiourea compound, or the like is preferably used. An amount of the sulfur sensitizer added is not particularly limited, and may be appropriately selected depending on the intended purpose. In view of various conditions such as the pH, the temperature and the size of silver salt particles at the time when the particles are chemically matured, is preferably in the range of $10^{-7}$ mole to $10^{-2}$ mole, and more preferably in the range of $10^{-5}$ mole to $10^{-3}$ mole, relative to one mole of silver salt.

—Selenium Sensitization—

As the selenium sensitizer used in the selenium sensitization is not particularly limited, and may be appropriately selected depending on the intended purpose. For instance, a known selenium compound can be used. A method of selenium sensitization is not particularly limited, and may be appropriately selected depending on the intended purpose. For example, a labile and/or non-labile selenium compound is added to the photosensitive material, and then emulsion is stirred at a high temperature of 40° C. or higher for a predetermined time, so as to perform selenium sensitization. Examples of the labile selenium compound include the compounds described in Japanese Patent Application Publication (JP-B) Nos. 44-15748 and 43-13489, and JP-A Nos. 04-109240 and 04-324855. In particular, the compounds represented by formulas (VIII) and (IX) in JP-A No. 04-324855 are preferably used.

An amount of the selenium compound added is not particularly limited, and may be appropriately selected depending on the intended purpose. In view of the silver halide particles used or the chemically matured conditions, it is approximately $10^{-8}$ mole to approximately $10^{-2}$ mole, preferably approximately $10^{-7}$ to approximately $10^{-3}$ mole, relative to one mole of silver salt (silver halide). The conditions of the chemical sensitization are not particularly restricted; however, the pH is 5 to 8, the pAg is 6 to 11 and preferably 7 to 10, and the temperature is 40° C. to 95° C. and preferably 45° C. to 85° C.

—Tellurium Sensitization—

A tellurium sensitizer used in the tellurium sensitization is not particularly limited, and may be appropriately selected depending on the intended purpose. For example, a compound that forms silver telluride that is presumed to form sensitization nuclei on a surface or inside of a silver salt particle. The formation ratio of silver telluride in a silver halide emulsion can be examined according to a method described in JP-A No 05-313284. Specifically, compounds described in U.S. Pat. Nos. 1,623,499, 3,320,069, and 3,772,031, Great Britain Patent Nos. 235,211, 1,121,496, 1,295,462, and 1,396,696, Canadian Patent No. 800,958, JP-A Nos. 04-204640, 04-271341, 04-333043, and 05-303157, J. Chem. Soc. Chem. Commun., p. 635 (1980); ibid., p. 1,102 (1979); ibid., p. 645 (1979); J. Chem. Soc. Perkin. Trans., Vol. 1, p. 2,191 (1980); edited by S. Patai (compiler), The Chemistry of Organic Selenium and Tellurium Compounds, Vol. 1 (1986); and ibid., Vol. 2 (1987) can be used. The compounds represented by formulas (II), (III) and (IV) in JP-A No. 05-313284 are particularly preferred.

An amount of the tellurium sensitizer used is not particularly limited, and may be appropriately selected depending on the intended purpose. In view of the silver salt particles used and the chemically matured conditions, it is approximately $10^{-8}$ mole to approximately $10^{-2}$ mole, preferably approximately $10^{-7}$ mole to approximately $10^{-3}$ mole, relative to one mole of silver salt. The conditions of the chemical sensitization are not particularly limited; however, the pH is 5 to 8, the pAg is 6 to 11 and preferably 7 to 10, and the temperature is 40° C. to 95° C. and preferably of 45° C. to 85° C.

—Noble Metal Sensitization—

A noble metal sensitizer used for the noble metal sensitization is not particularly limited, and may be appropriately selected depending on the intended purpose. Examples thereof include gold, platinum, palladium, and iridium. Of these, gold sensitization is preferred. A gold sensitizer used in the gold sensitization is not particularly limited, and may be appropriately selected depending on the intended purpose. Examples thereof include chloroauric acid, potassium chloroaurate, potassium auric thiocyanate, gold sulfide, gold (I) thioglucose, gold (I) thiomannose. The amount of the gold sensitizer used is not particularly limited, and may be appropriately selected depending on the intended purpose. For example, it is $10^{-7}$ mole to $10^{-2}$ mole, relative to one mole of silver salt.

—Reduction Sensitization—

A reduction sensitizer used in the reduction sensitization is not particularly limited, and may be appropriately selected depending on the intended purpose. Examples of the reduction sensitizer include stannous salts, amines, formamidinesulfinic acid, and silane compounds.

—Spectral sensitization—

A sensitizing dye used in spectral sensitization is not particularly limited, and may be appropriately selected depending on the intended purpose. Examples thereof include a cyanine dye, a merocyanine dye, a complex cyanine dye, a complex merocyanine dye, a holopolar cyanine dye, a styryl dye, a hemicyanine dye, an oxonol dye and a hemioxonol dye. The sensitizing dye may be used in combination. The sensitizing dye may be added to a silver salt emulsion by directly dispersing the dye in the emulsion or by dissolving the dye in a solvent and adding the solution to the emulsion. Examples of the solvent used herein includes water, methanol, ethanol, propanol, acetone, methyl cellosolve, 2,2,3,3-tetrafluoropropanol, 2,2,2-trifluoroethanol, 3-methoxy-1-propanol, 3-methoxy-1-butanol, 1-methoxy-2-propanol, N,N-dimethylformamide and mixtures thereof.

The amount of the sensitizing dye used is not particularly limited, and may be appropriately selected depending on the intended purpose. For example, in view of the shape, size, etc. of the silver salt particles, it is $4\times10^{-6}$ mole to $8\times10^{-3}$ relative to one mole of silver salt. For example, when the silver halide particles have a size of 0.2 μm to 1.3 μm, the amount of the sensitizing dye added is preferably $2\times10^{-7}$ to $3.5\times10^{-6}$, more preferably $6.5\times10^{-7}$ to $2.0\times10^{-6}$, relative to 1 $m^2$ of a surface area of the silver salt particle.

<Conductive Layer>

The conductive layer is not particularly limited, and may be appropriately selected depending on the intended purpose, as long as it contains the conductive fibers described below. The conductive layer may contain a conductive particle in addition to the conductive fibers. The amount of the conductive fibers contained in the conductive layer is not particularly limited, and may be appropriately selected depending on the intended purpose. For example, it may be 0.05% by mass to 15% by mass, before exposing, developing, and fixing are performed. When the amount is less than 0.05% by mass, the conductive fibers do not obtain a function of a surface electrode. When the amount is more than 15% by mass, decrease in transmittance and increase in haze outstandingly occur, causing problems in practical use of a transparent conductive film.

When the conductive layer contains the conductive fibers, the conductive layer may further contain a binder, so as to impart adhesion to a layer adjacent to the conductive layer. As the binder, the binder used in the silver salt emulsion may be used, and a water-soluble polymer may be used. The structure of the conductive layer is not particularly limited, and may be appropriately selected depending on the intended purpose. For example, the conductive layer may be formed over a surface of an undercoating layer, which surface is opposite to a support, either surface of the silver salt-containing emulsion layer, or both surfaces of the silver salt-containing emulsion layer. The thickness of the conductive layer is preferably 3 μm or less, more preferably 0.05 μm to 2 μm, in terms of transparency. A coating and forming method of the conductive layer is not particularly limited can be appropriately selected from known coating and forming methods thereof.

—Conductive Fibers—

The conductive fibers are not particularly limited, and may be appropriately selected depending on the intended purpose. Examples thereof include ultra fine carbon fibers, metal nanotubes, metal nanowires, metal oxide nanotubes and metal oxide nanowires. Of the conductive fibers, in terms of satisfying both transparency and conductivity the metal nanowires and the carbon nanotubes are preferable, and the metal nanowires are more preferable. The materials of the conductive fibers are not particularly limited, and may be appropriately selected depending on the intended purpose. Examples thereof include metals, metal oxides and carbons.

—Ultra Fine Carbon Fibers—

Examples of the ultra fine carbon fibers include carbon nanotubes, carbon nanohorns, carbon nanowires, carbon nanofibers, and graphite fibrils. Of these, the carbon nanotubes are preferable, because a conductivity network is advantageously formed.

—Carbon Nanotubes—

The carbon nanotubes are not particularly limited, and may be appropriately selected depending on the intended purpose. For example, each of the carbon nanotube may be a tubular-shaped carbon formed of elongated carbon fibers each having a diameter (minor axis length) of 1 nm to 1,000 nm, a length (major axis length) of 0.1 μm to 1,000 μm, and an aspect ratio of 100 to 10,000. When the diameter is less than 1 nm, there is difficulty in stability and mass production. When the diameter is more than 1,000 nm, there is a problem in satisfying both transparency and conductivity. When the length is less than 0.1 μm, the large coating amount of carbon nanotubes is necessary for forming a conductivity network, causing decrease in transmittance. When the length is more than 1,000 μm, coating failure occurs because of aggregation formed in a coating liquid retained in a liquid retaining portion when coating is performed for a long time.

As a method for producing carbon nanotubes, an arc-discharge method, a laser evaporation method, a thermal CVD method and a plasma CVD method are known. The carbon nanotubes formed by the arc-discharge method and laser evaporation method are classified into single wall nanotubes (SWNTs) formed of only one graphene sheet and multi wall nanotubes (MWNTs) formed of a plurality of graphene sheets. By the thermal CVD method and plasma CVD method, MWNTs can be mainly produced. The SWNTs have a tubular structure formed by curling one graphene sheet in which carbon atoms are hexagonally bonded to one another via strong bonds called an SP2 bond.

The carbon nanotubes (SWNTs or MWNTs) are tubular materials each having a structure formed by curling one to several graphene sheets, and having a diameter of 0.4 nm to 10 nm and a length of 0.1 μm to several hundreds micrometers. Depending on the direction in which the graphene sheet(s) is (are) curled, the formed carbon nanotubes have unique properties that they become a metal or semiconductor.

—Metal Nanotubes, Metal Oxide Nanotubes, Metal Nanowires, and Metal Oxide Nanowires—

The metal nanowires and metal oxide nanowires are not particularly limited and may be appropriately selected depending on the intended purpose. Examples thereof include single metal elements, and a plurality of metal elements, such as core-shell structures, alloys, plated metal nanowires or the like.

Examples of metals in the metal nanotubes and metal nanowires include platinum, gold, silver, copper, nickel, and silicon. These may be used alone or in combination. Of these, silver alone, or a mixture of silver and other metals are preferable, in terms of improvement of conductivity.

Examples of the metal oxides used in the metal oxide nanotubes and metal oxide nanowires include ITO, zinc oxide, tin oxide, and compounds thereof doped with impurities for the purpose of improving the conductivity.

The diameter (minor axis length) of each metal nanowire or the metal oxide nanowire is preferably 300 nm or less, more preferably 200 nm or less, even more preferably 100 nm or less. The diameter thereof is particularly preferably 8 nm to 50 nm. When the diameter thereof is more than 300 nm, there may be cases where sufficient transparency cannot be attained, probably because scattering occurs due to the metal nanowires. When the diameter thereof is too small, the antioxidation property thereof is degraded, potentially degrading the durability thereof. Therefore, the diameter of each metal nanowire or the metal oxide nanowire is preferably 5 nm or more.

The length (major axis length) of each metal nanowire or the metal oxide nanowires is preferably 1 μm or more, more preferably 5 μm or more, even more preferably 10 μm or more. When the major axis length of the metal nanowire is too long, aggregated matters may be generated during the production process, probably because the metal nanowires are tangled each other. Therefore, the major axis length of each metal nanowire is preferably 1 mm or less, more preferably 500 μm or less, even more preferably 40 μm or less. When the major axis length of the metal nanowire is less than 1 μm, sufficient conductivity may not be attained probably because it is difficult to form a dense network.

Here, the minor axis length and major axis length of the nanowire can be obtained, for example, by using a transmission electron microscope (TEM) and an optical microscope, and observing images of TEM or the optical microscope. The minor axis length and major axis length of the nanowire are obtained by measuring the statistically meaningful number of nanowires (for example, 600 nanowires or more), and calculating the average values thereof.

It is preferred that the nanowires do not contain inorganic ions such as alkali metal ions, alkaline earth metal ions, halide ions, in terms of reliability when the resulting conductive film containing the nanowires is incorporated in an electronic device. The electric conductivity of the metal nanowires dispersed in water is preferably 1 mS/cm or less, more preferably 0.1 mS/cm or less, and particularly preferably 0.05 mS/cm or less. The viscosity of the metal nanowires dispersed in water at 20° C. is preferably 0.5 mPa·s to 100 mPa·s, more preferably 1 mPa·s to 50 mPa·s.

[Method for Producing Nanowired]

A method for producing the nanowires is not particularly limited, and may be appropriately selected depending on the intended purpose. In terms of a yield of nanowires and dispersibility thereof, the nanowires are preferably produced by reducing a metal ion as a starting material for forming the nanowires in a solvent, in which a halogen compound or halogenated metal fine particles and a dispersing agent are dissolved as described below.

—Halogen Compound and Halogenated Metal Fine Particles—

The halogen compound or halogenated metal fine particle, which is used for the metal nanowires, is not particularly limited, and may be appropriately selected depending on the intended purpose, as long as it contains bromine, chlorine, or iodine. By using the halogen compound or halogenated metal fine particle in the production of the metal nanowires, the production ratio of nanowires increases, and excellent dispersion stability can be obtained.

Examples of the halogen compound include alkali halide such as sodium bromide, sodium chloride, sodium iodide, potassium bromide, potassium chloride and potassium iodide. Some halogen compounds, such as alkyl quaternary ammonium halide, may serves as a dispersing agent as described below, and these can be also preferably used.

Examples of the halogenated metal fine particles include fine particles of halogenated silver such as silver bromide, silver iodide, and silver chloride. The halogen compound may be used in combination with the halogenated silver fine particles.

The single compound may be used as the dispersing agent and the halogen compound or halogenated silver fine particles. The compound used for both the dispersing agent and the halogen compound or halogenated metal fine particles is, for example, hexadecyl-trimethylammonium bromide (HTAB) containing an amino group and a bromide ion, or hexadecyl-trimethylammonium chloride (HTAC) containing an amino group and a chloride ion. These may be used in combination with those having different alkyl chains and different types of halogens.

The timing when the halogen compound or halogenated metal fine particles is added may be before or after addition of the dispersing agent, and before or after addition of the reducing agent. The timing when the halogen compound or halogenated metal fine particles and the dispersing agent is added may be before or after addition of the reducing agent, and may be before or after addition of the metal ion or halogenated metal fine particles as a starting material for forming the metal nanowires. For producing metal nanowires having better monodispersibility, the halogen compound is preferably added twice or more times in a divided manner, probably because core formation and growth of particles can be controlled.

—Dispersing Agent—

A dispersing agent used for producing the metal nanowires is not particularly limited, and may be appropriately selected depending on the intended purpose, as long as it can disperse the metal nanowires in a solvent used for producing the metal nanowires. Examples of the dispersing agent include amino group-containing compounds, thiol group-containing compounds, sulfide group-containing compounds, amino acids or derivatives thereof, peptide compounds, polysaccharides, natural polymers derived from polysaccharides, synthetic polymers, and polymers derived from those mentioned above such as gels.

Examples of the polymers include protective colloid polymers such as gelatin, polyvinyl alcohol, methyl cellulose, hydroxypropyl cellulose, polyalkylene amine, partial alkyl ester of polyacrylic acid, polyvinyl pyrrolidone and a polyvinyl-pyrrolidine copolymer.

The compound structures usable for the dispersing agent can be, for example, referred to the description in "Pigment Dictionary" (edited by Seishiro Ito, published by ASAKURA PUBLISHING CO., (2000)). Depending on the type of the dispersing agent for use, the shapes of obtained metal nanowires can be changed.

The timing when the dispersing agent is added may be before preparation of particles in the presence of a dispersing agent such as a polymer, or after preparation of particles for controlling the dispersion state of the particles. In the case where the addition of the dispersing agent is carried out twice or more times, the amount of the dispersion agent to be added each time needs to be adjusted depending on the desired length (major axis length) of the metal nanowires. This is because it is considered that the length of the metal nanowires depends on the control of the amount of the metal particles serving as cores.

—Solvent—

As the solvent used for producing the metal nanowires by performing the reduction, a hydrophilic solvent is preferable because of easiness of desalination and concentration in the following steps. Examples of the hydrophilic solvent include: water; alcohols such as methanol, ethanol, propanol, isopropanol, butanol and ethylene glycol; ethers such as dioxane and tetrahydrofuran; and ketenes such as acetone.

—Reduction—

A reduction method for producing the metal nanowires is not particularly limited, can be appropriately selected depending on the intended purpose, as long as metal ions can be reduced to be metal nanowires. For example, the reducing agent described below is dissolved in a solvent and then heated so as to initiates a reduction reaction.

The heating temperature is preferably 250° C. or less, more preferably 20° C. to 200° C., even more preferably 30° C. to 180° C., particularly preferably 40° C. to 170° C. If necessary, the temperature may be changed during the formation of metal fine particles. To change the temperature in the course of the formation of metal fine particles may contribute to the control for the formation of the core of the particle, preventing the generation of re-grown cores and promoting selective growth to improve the monodispersibility.

When the heating temperature is more than 250° C., the transmittance may be lowered in terms of the evaluation of the coated film, probably because the angles of the cross section of the metal nanowire become sharp. Moreover, as the heating temperature is getting lower, the metal nanowires tends to tangle and dispersion stability thereof is lowered, probably because the yield of core formation is lowered and the metal nanowires become too long. This tendency becomes significant at the heating temperature of 20° C. or less.

—Reducing Agent—

It is preferred that a reducing agent be added in the reduction method for producing the metal nanowires, because the reducing agent can promote reduction reaction of metal ions. Even when the heating is performed, the reducing agent can be added. The reducing agent is not particularly limited, and may be appropriately selected depending on the intended purpose. Examples of the reducing agent include: metal salts of boron hydrides such as sodium boron hydride and potassium boron hydride; aluminum hydride salts such as lithium aluminum hydride, potassium aluminum hydride, cesium aluminum hydride, beryllium aluminum hydride, magnesium aluminum hydride and calcium aluminum hydride; sodium sulfite; hydrazine compounds; dextrin; hydroquinones;

hydroxylamines; citric acid and salts thereof; succinic acid and salts thereof; ascorbic acid and salts thereof; alkanol amines such as diethylamino ethanol, ethanol amine, propanol amine, triethanol amine and dimethylamino propanol; aliphatic amines such as propyl amine, butyl amine, dipropylene amine, ethylene diamine and triethylenepentamine; heterocyclic amines such as piperidine, pyrrolidine, N-methyl pyrrolidine and morpholine; aromatic amines such as aniline, N-methyl aniline, toluidine, anisidine and phenetidine; aralkyl amines such as benzyl amine, xylene diamine and N-methylbenzyl amine; alcohols such as methanol, ethanol and 2-propanol; ethylene glycol; glutathione; organic acids such as citric acid, malic acid and tartaric acid; reducing sugars such as glucose, galactose, mannose, fructose, sucrose, maltose, raffinose and stachyose; and sugar alcohols such as sorbitol. Of these, the reducing sugars, sugar alcohols that are derivatives of the reducing sugars, and ethylene glycol are particularly preferable, in terms of easiness of controlling reduction speed.

There is a case where the reducing agents may also function as a dispersing agent or a solvent depending on the types of the reducing agents, and those reducing agents are also preferably used. As such reducing agent, ethylene glycol is exemplified.

The timing when the reducing agent is added may be before or after addition of a dispersing agent, and may be before or after addition of the halogen compound or halogenated metal fine particles.

—Other Treatment—

In the method for producing the metal nanowires, the solution in which the metal nanowires are dispersed in a solvent may be subjected to any treatment, such as desalination, concentration or the like. Desalination may be performed by means of ultrafiltration, dialysis, gel filtration, decantation, centrifugation, etc., after the metal nanowires have been formed.

<Other Layers>

The photosensitive material for forming a conductive film of the present invention may include a support which imparts a constant mechanical strength to the photosensitive material for forming a conductive film, an undercoating layer for improving adhesion thereof to the support, and a protective layer for exhibiting an effect of scuff proof and improvement in mechanical properties, as well as the silver salt-containing emulsion layer and/or the conductive layer. The other layers except the support may be formed in any position of the photosensitive material for forming a conductive film. In terms of easiness of coating, the other layers are preferably formed over the surface of the support where the silver salt-containing emulsion layer is formed.

—Support—

As a support used for the photosensitive material for forming a conductive film of the invention, a plastic film, a plastic plate, a glass plate and so on can be used. Specifically, the plastic film or the plastic plate formed of a raw material having a melting point of approximately 290° C. or less, for instance, polyethylene terephthalate (PET) (melting point: 258° C.), polyethylene naphthalate (PEN) (melting point: 269° C.), polyethylene (PE) (melting point: 135° C.), polypropylene (PP) (melting point: 163° C.), polystyrene (melting point: 230° C.), polyvinyl chloride (melting point: 180° C.), polyvinylidene chloride (melting point: 212° C.), triacetyl cellulose (TAC) (melting point: 290° C.), or the like are preferably used. For a transparent electromagnetic wave shielding film, polyethylene terephthalate is particularly preferably used in terms of the transparency, and processability.

The transparency of the support is preferably high, because a transparent conductive film is demanded for transparency.

The support has a transmittance in the entire visible region of preferably 70% or more, more preferably 85% or more, and particularly preferably 90% or more. In the present invention, a support which is colored so as not to impair a desired transparency may be used.

—Undercoating Layer—

The undercoating layer is not particularly limited, and may be appropriately selected depending on the intended purpose. For example, the undercoating layer may be formed of the silver salt emulsion used for the silver salt-containing emulsion layer, or may be formed of the binder alone in the emulsion. Of these, the undercoating layer preferably contains a metal salt emulsion in terms of simplifying a coating step. The structure of the undercoating layer is not particularly limited, and may be appropriately selected depending on the intended purpose. For example, the undercoating layer is preferably directly formed on the support. The thickness of the undercoating layer is preferably 2 μm or less, and more preferably 0.05 μm to 1.5 μm, in terms of adhesion. A method for coating and forming the undercoating layer is not particularly limited, and may be appropriately selected from known coating and forming methods.

—Protective Layer—

The protective layer is not particularly limited, and may be appropriately selected depending on the intended purpose, as long as it exerts the above effect. The protective layer may be a layer formed of a binder such as gelatin or a polymer. The structure of the protective layer is not particularly limited, and may be appropriately selected depending on the intended purpose. The protective layer may be formed on the silver salt-containing emulsion layer. The thickness of the protective layer is preferably 0.2 μm or less, and more preferably in the range 0.02 μm to 0.1 μm, in terms of exerting mechanical characteristics. A method of coating and forming the protective layer is not particularly limited, and may be appropriately selected from known coating and forming methods.

The other layers may contain the conductive fibers and binder, and be formed on either surface of the silver salt-containing emulsion layer, when viewed from the support. It is also preferred to contain the conductive fibers and the binder in a layer adjacent to the silver salt-containing emulsion layer, in terms of conduction with the silver salt-containing emulsion layer.

In an embodiment of the present invention, examples of the layer structure of the photosensitive material for forming a conductive film of the invention, in which the conductive fiber-containing layer is formed separately from the protective layer or undercoating layer, include the following layer structures (1) to (4), which will each be described in the order from a layer nearest to the support toward a layer farthest thereto:

(1) undercoating layer/silver salt-containing emulsion layer/conductive fiber-containing layer (conductive layer)/protective layer or adhesion imparting layer containing silica;

(2) undercoating layer/silver salt-containing emulsion layer/conductive fiber-containing layer (conductive layer);

(3) conductive fiber-containing layer (conductive layer)/silver salt-containing emulsion layer/protective layer; and (4) undercoating layer/first silver salt-containing emulsion layer/second silver salt-containing emulsion layer/conductive fiber-containing layer (conductive layer)/protective layer (the amount of the silver salt is different between the first silver salt-containing emulsion layer and the second silver salt-containing emulsion layer.).

In the layer structure, the conductive fiber-containing layer may be the topmost layer without forming any protective layer, as in (2).

[Method for Producing Photosensitive Material for Forming Conductive Film]

A method for producing a photosensitive material for forming a conductive film of the present invention is not particularly limited, and may be appropriately selected depending on the intended purpose. For example, a coating solution for forming a silver salt-containing emulsion layer is applied to a support by an appropriate method, such as a spin coating, bar coating, wire bar coating, blade coating, die coating, slit coating, etc. and then dried.

In the case where the photosensitive material for forming a conductive film includes a silver salt-containing emulsion layer containing a silver salt emulsion and a conductive layer containing conductive fibers, the photosensitive material may be formed in the following manner that: a coating solution for forming the silver salt-containing emulsion layer is applied and dried in the same manner as described above, and a coating solution for forming the conductive layer is applied by the above-described method, and then dried; or a coating solution for forming the silver salt-containing emulsion layer and a coating solution for forming the conductive layer are applied simultaneously, and dried. Moreover, each layer is dried, and then subjected to calender process for the purpose of improvement in conduction of the conductive fibers. The solutions for layers are simultaneously applied, and then exposed and developed so as to produce a conductive film. As a result, production process is simplified, to thereby improve yield. When the coating solution for forming a conductive fiber-containing layer is applied to a mesh-shaped conductive film, the conductive fibers are not uniformly dispersed and aggregate on the mesh. However, by simultaneously applying the solutions for layers, a conductive layer containing highly dispersed conductive fibers can be obtained without causing above problems.

In the case where the conductive fibers and the binder are contained in the silver salt-containing emulsion layer, the amount of the conductive fibers is preferably 0.005 g/m$^2$ to 0.2 g/m$^2$, more preferably 0.005 g/m$^2$ to 0.17 g/m$^2$, even more preferably 0.01 g/m$^2$ to 0.15 g/m$^2$, particularly preferably 0.01 g/m$^2$ to 0.125 g/m$^2$.

In the case where a layer to which the conductive fibers and the binder are added (for example, a conductive layer or protective layer) is formed over a surface of the silver salt-containing emulsion layer, which surface is opposite to a support, or the layer to which the conductive fibers and the binder are added (for example, an undercoating layer) is formed over the other surface of the silver salt-containing emulsion layer, which surface is close to the support, the amount of the conductive fibers is not particularly limited, and may be appropriately selected depending on the intended purpose. It is 0.005 g/m$^2$ to 0.2 g/m$^2$, preferably 0.005 g/m$^2$ to 0.17 g/m$^2$, more preferably 0.01 g/m$^2$ to 0.15 g/m$^2$, and particularly preferably 0.01 g/m$^2$ to 0.125 g/m$^2$. When the coated amount of the conductive fibers is more than the upper limit, transparency is not enough for practical use, and the resulting photosensitive material is not appropriately used as a transparent conductive film. Moreover, when the coated amount of the conductive fibers is more than the upper limit, it is difficult for the conductive fibers to uniformly disperse in the layer upon coating of the conductive fibers, causing increase in production failure. On the other hand, when the coated amount is less than the lower limit, the in-plane electrical properties is insufficient. For example, when it is used in an EL element, luminance is likely to be insufficient for practical use.

A layer to which the conductive fibers and the binder are added is preferably a layer provided above the silver salt-containing emulsion layer, and for example, it is a protective layer. In the case where the protective layer containing the conductive fibers is used as an electrode, it is advantageous for conductivity, and in the case where the resulting conductive film having such protective layer is included in a light-emitting device such as an inorganic EL element, luminance of the light-emitting device is highly improved.

When the layer containing the conductive fibers and the binder is the protective layer, the coated amount of the conductive fibers is as described above. The coated amount of the binder is 0.5 g/m$^2$ or less, more preferably 0.4 g/m$^2$ or less, particularly preferably 0.3 g/m$^2$ or less. The smaller the coated amount of the binder is, the better the conductivity becomes. When the coated amount of the binder is large, the amount of the remaining solvent of the coating solution containing the binder becomes large, thus, the remaining solvent may adversely affect other functional layers. Therefore, the binder is not necessarily contained in the protective layer. When the coated amount of the binder is reduced, uneven coating of the conductive fibers can be prevented by using a die coating method, slit coating method or the like.

(Conductive Material)

The conductive material of the present invention is obtained by exposing the above-described photosensitive material for forming a conductive film patternwise to light, and then developing the exposed material.

The conductive material of the present invention is not particularly limited, and may be appropriately selected depending on the intended purpose, as long as the conductive material has the structure described above. For example, the conductive material of the present invention may include a layer containing metal silver formed by exposing, developing and fixing the silver salt-containing emulsion layer formed on a support, or a layer containing metal silver and conductive fibers formed by exposing, developing and fixing the silver salt-containing emulsion layer containing the silver salt emulsion and the conductive fibers formed on a support. Alternatively, the photosensitive material for forming a conductive film includes on a support a layer containing metal silver and a layer containing conductive fibers formed by exposing, developing and fixing the silver salt-containing emulsion layer and the conductive layer containing the conductive fibers. Examples of those obtained by exposing, developing and fixing the silver salt-containing emulsion layer of the photosensitive material for forming a conductive film of the present invention include a silver foil mesh pattern, a copper foil mesh pattern, and a mesh pattern formed by a printing system. Examples of those obtained by exposing, developing and fixing the conductive layer containing the conductive fibers of the photosensitive material for forming a conductive film of the present invention include a layer containing the conductive fibers.

The total light transmittance of the conductive material of the invention is not particularly limited, and may be appropriately selected depending on the intended purpose. It is preferably 81% or more, more preferably 82% or more, even more preferably 83% or more, particularly preferably 84% or more, particularly more preferably 85% or more, and particularly even more preferably 90% or more. In the conductive material of the invention, the transmittance of its openings, without containing any mesh pattern region obtained by exposing and developing, is preferably 81% or more, more preferably 82% or more, even more preferably 83% or more, particularly preferably 84% or more, particularly more preferably 85% or more, and particularly even more preferably 90% or more. When metallic spherical particles such as silver particles or copper particles; or spherical particles of metal oxides and complex oxides thereof are used as the conductive particles, it is necessary to apply a large amount of the conductive particles in order to decrease the resistance. As a result, the transmittance of the openings decreases, and the transparency may become insufficient for practical use. In the conductive material of the present invention, the conductive fibers as described above are preferably used from the viewpoint of the transparency and resistance.

In the conductive material of the present invention, the surface resistances of a metal silver-containing layer obtained by exposing, developing and fixing the silver salt-containing emulsion layer of the photosensitive material for forming a conductive film of the present invention (hereinafter, may be referred to as a first conductive film), a conductive fiber-containing layer obtained by exposing, developing and fixing the conductive layer containing the silver salt-containing emulsion and the conductive fibers (hereinafter, may be referred to as a second conductive film), and the conductive layer containing the conductive fibers and without containing the silver salt-containing emulsion (hereinafter, may be referred to as a third conductive film) are respectively preferably 0.01 Ω/square to 500 Ω/square. When these conductive films have the surface resistances of the above-mentioned range, the in-plane electrical properties of the conductive material becomes uniform, and, in the case where it is used in an inorganic EL element, sufficient luminance can be obtained in the entire in-plane.

In the invention, the surface resistance may be measured with a resistivity meter for low resistivity LORESTA GP (product name, manufactured by Mitsubishi Chemical Corporation), NON-CONTACT CONDUCTANCE MONITOR MODEL 717B (product name, manufactured by DELCOM Instruments, Inc.), or a digital ultra high resistance/microammeter 8340A (product name, manufactured by ADC Corporation).

An embodiment of the conductive material of the present invention, which is obtained by exposing the photosensitive material for forming a conductive film of the present invention patternwise to light, and then developing the exposed material, will be described in detail, hereinafter.

In the present invention, the shape obtained by the pattern exposure and the development may be a mesh shape. Examples thereof include a grid shape, in which straight lines cross each other at right angles, and a wavy line shape, which has, between its crossing portions, at least a curve. For example, the grid-shaped mesh preferably has the width of lines and that of spaces (line/space) of 20 μm to 1,000 μm, and more preferably 20 μm to 300 μm. In this case, the pitch thereof is preferably 200 μm to 1,000 μm, and more preferably 200 μm to 600 μm.

In the present invention, a conductive layer may be further formed by applying a conductive polymer onto a conductive film which has been formed by exposing and developing, as long as the conductivity and transparency are ensured.

—Exposure—

An exposure method is not particularly limited, and may be appropriately selected depending on the intended purpose, as long as the exposure is performed at a predetermined wavelength from the side of a layer containing the photosensitive material for forming a conductive film. The exposure can be performed by a surface exposure utilizing a photomask, or by a scanning exposure with a laser beam. In this case, a refractive exposure employing a lens or a reflective exposure employing a reflecting mirror may be employed, and an exposure system, such as a contact exposure, a proximity exposure, a reduced projection exposure or a reflective projection exposure, can be used.

—Development—

The developing method is not particularly limited, and may be appropriately selected depending on the intended purpose. The development can be performed by a commonly used developing technology employed, for example, in a silver halide photographic film, printing paper, films for making printing-plates, and emulsion masks for photomasks, etc.

In the present invention, the exposure and development are performed, so as to form a pattern of the metal silver region in an exposed portion as well as to form a light transmissible region in an unexposed portion.

The development of the photosensitive material for forming a conductive film of the present invention may include a fixation performed to remove the silver salt in the unexposed portion and attain stabilization. For the fixation performed after exposing and developing the photosensitive material for forming a conductive film of the present invention, there may be used any fixing technology used for silver halide photographic films, printing paper, films for making printing plates, emulsion masks for photomasks, and the like.

In the case where the silver salt-containing emulsion layer contains the conductive fibers in the thus obtained conductive material of the present invention, the conductive fibers are dispersed in the light transmissible region, from which the silver salt has dropped out, so that a conductive layer having a higher resistance than that of the metal silver region is formed. When the conductive fibers are contained in any layer other than the silver salt-containing emulsion layer, a conductive layer in which the conductive fibers are dispersed is formed in the light transmissible region in the same manner as in the silver salt-containing emulsion layer containing the conductive fibers.

The application of the conductive material of the present invention is not particularly limited, and may be appropriately selected depending on the intended purpose, as long as it requires transparency and conductivity. Examples thereof include an inorganic EL element, an organic EL element, a display element such as liquid crystal display, a multilayer board such as IC substrate, a resistance film, a transparent conductive film for a touch panel by an electrostatic capacity system, etc., various circuit patterns, and various devices such as a solar battery formed on a substrate. Of these, the conductive material of the present invention is preferably used as an EL element, or a transparent electrode for a touch panel.

A dispersion-type electroluminescent element is driven by alternating current. Typically, it is driven by use of an AC power at 100 V and 50 Hz to 400 Hz. When the area of the element is small, the luminance increases approximately in proportion to applied voltage and frequency. However, in the case of any large-area element having an area of 0.25 $m^2$ or more, the capacity component of the element increases so that the impedance matching between the element and the power source is lost or the time constant necessary for storing electric charges into the element becomes large. For this reason, the element easily turns into a state that the element does not receive sufficient supply of power even when the voltage and frequency supplied thereto are made high, in particular, even when the frequency is made high. In the case where, in particular, elements having an area of 0.25 $m^2$ or more are driven by AC having a frequency of 500 Hz or more, the voltage applied thereto is often lowered in accordance with an increase in the driving frequency. As a result, decrease in the luminance is often caused.

On the other hand, an electroluminescent element in which the conductive material of the present invention is used as an electrode can be driven by a high-frequency power even when the size of the element is as large as 0.25 m² or more. As a result, a high luminance can be given. In this case, a driving power having a frequency of 500 Hz to 5 kHz is preferred and a driving power having a frequency of 800 Hz to 3 kHz is more preferred.

(Display Element)

A display element used in the present invention includes the conductive material of the present invention, and other members and components as necessary.

The display element of the present invention is not particularly limited, and may be appropriately selected depending on the intended purpose. For example, the display element is a liquid crystal display element, an inorganic or organic EL element, a TFT substrate, or the like. For example, the liquid crystal display element is formed from an element substrate, in which the patterned conductive material of the present invention is formed on the substrate, and a color filter substrate. Specifically, these substrates are positioned/pressure-bonded to each other and assembled through thermal treatment, and then liquid crystals are injected thereinto and finally, the inlet port is sealed. In this case, a transparent conductive film formed on the color filter may be also formed of the conductive material of the present invention. In an employable, alternative method for producing the liquid crystal display element, after liquid crystals have been spread on the element substrate, a substrate is superposed on the element substrate and the resultant product is sealed so that liquid crystals are not leaked.

In this manner, a highly transparent conductive film formed of the conductive material of the present invention can be used as a display element, such as a liquid crystal display element.

The liquid crystals (i.e., liquid crystal compounds and liquid crystal compositions) used in the liquid crystal display element are not particularly limited, and may be appropriately selected depending on the intended purpose. Any known liquid crystal compounds and liquid crystal compositions can be used.

(Solar Battery)

A solar battery used in the present invention includes the conductive material of the present invention, and other members and components as necessary.

The solar battery used in the present invention is not particularly limited, and may be appropriately selected depending on the intended purpose, as long as it has the above-described structure. Any general solar battery device can be used. Examples thereof include monocrystalline silicon solar battery devices, polycrystalline silicon solar battery devices, amorphous silicon solar battery devices with single junctions or tandem structures, III-V compound semiconductor solar battery devices such as gallium arsenide (GaAs) semiconductor solar battery devices and indium phosphide (InP) semiconductor solar battery devices, II-VI compound semiconductor solar battery devices such as cadmium telluride (CdTe) semiconductor solar battery devices, I-III-VI compound semiconductor solar battery devices such as copper/indium/selenium (so-called CIS) semiconductor solar battery devices, copper/indium/gallium/selenium (so-called CIGS) semiconductor solar battery devices and copper/indium/gallium/selenium/sulfur (so-called CIGSS) semiconductor solar battery devices, dye-sensitized solar battery devices and organic solar battery devices. In the present invention, among these solar battery devices, preference is given to amorphous silicon solar battery devices with tandem structures, and I-III-VI compound semiconductor solar battery devices such as copper/indium/selenium (so-called CIS) semiconductor solar battery devices, copper/indium/gallium/selenium (so-called CIGS) semiconductor solar battery devices and copper/indium/gallium/selenium/sulfur (so-called CIGSS) semiconductor solar battery devices. A thin film solar battery using $CuInSe_2$ (CIS thin film), which is a semiconductor thin film of a chalcopyrite structure consisting of a Ib group element, a IIIb group element and a VIb group element, or $Cu(In,Ga)Se_2$ (CIGS thin film), in which Ga is solid soluted to $CuInSe_2$, for a light absorption layer has high energy conversion efficiency, and, advantageously, the efficiency thereof is deteriorated due to light radiation in only a small degree.

In the case of an amorphous silicon solar battery device with a tandem structure or the like, any of the following layers can be used as a photoelectric conversion layer: an amorphous silicon thin film, a fine crystalline silicon thin film, these thin films containing germanium, and two or more of such thin films constituting a tandem structure. These layers are formed by plasma CVD or the like.

<Conductive Material>

The conductive material of the present invention (hereinafter, also referred to as a transparent conductive layer) used in the solar battery can be used as any member which requires conductivity in the solar battery. The transparent conductive layer may be included in any portion of the solar battery device; however, it is preferably adjacent to the photoelectric conversion layer, in terms of conversion efficiency. The positional relationship between the transparent conductive layer and the photoelectric conversion layer is preferably as shown in the following non-limiting structures. Also, in each of the following structures, not all components constituting a solar battery device are mentioned. The components are mentioned to such an extent that the positional relationship between the transparent conductive layer and the photoelectric conversion layer can be understood.

(A) Substrate—Transparent conductive layer (conductive material)—Photoelectric conversion layer (B) Substrate—Transparent conductive layer (conductive material)—Photoelectric conversion layer—Transparent conductive layer (conductive material)

(C) Substrate—Electrode—Photoelectric conversion layer—Transparent conductive layer (conductive material)

(D) Back electrode—Photoelectric conversion layer—Transparent conductive layer (conductive material)

The conductive material of the present invention used in the solar battery can be applied to a crystalline (single-crystalline, polycrystalline, etc.) silicon solar battery in which a collector electrode is generally not a transparent electrode. In the crystalline silicon solar battery, a silver-deposited electrical wire or a silver-pasted electrical wire is generally used as a collector electrode; application of the transparent conductive layer of the present invention to the crystalline silicon solar battery makes it possible to yield high photoelectric conversion efficiency in this case as well.

The transparent conductive layer for use in the solar battery has high transmittance with respect to light in the infrared wavelength region and has small sheet resistance. Therefore, the transparent conductive layer can be suitably used in a solar battery which absorbs light in the infrared wavelength region, for example an amorphous silicon solar battery with a tandem structure, or a I-III-VI compound semiconductor solar battery such as a copper/indium/selenium (so-called CIS) semiconductor solar battery, a copper/indium/gallium/ selenium (so-called CIGS) semiconductor solar battery or a copper/indium/gallium/selenium/sulfur (so-called CIGSS) semiconductor solar battery.

[Method for Producing Transparent Conductive Layer]

A method for producing the transparent conductive layer is not particularly limited and can be appropriately selected depending on the intended purpose, as long as the method is performed in accordance with the method for producing the conductive material. For example, a coating solution, in which a composition containing the silver salt emulsion and/or the conductive fibers are dispersed, is applied to a substrate, and dried.

A method of applying the coating solution is not particularly limited, and may be appropriately selected depending on the intended purpose. Examples thereof include web coating, spray coating, spin coating, doctor blade coating, screen printing, gravure printing and inkjet processing. Particularly, Web coating, screen printing and inkjet processing enable roll-to-roll process to a flexible substrate.

The order of applying the coating solution is not particularly limited, and may be appropriately selected depending on the intended purpose. For example, the coating solution is applied after the buffer layer has been formed. Alternatively, the coating solution is applied, after the buffer layer has been formed and then a ZnO layer has been formed.

The drying performed after the coating solution is applied is not particularly limited, and may be appropriately selected depending on the intended purpose. For example, the coating solution may be annealed by heating. At this time, the heating temperature is preferably in the range of 50° C. to 300° C., more preferably 70° C. to 200° C.

The substrate is not particularly limited, and may be appropriately selected depending on the intended purpose. Examples of the substrate include, but are not limited to, the following. Of these, the substrate for the element is preferably in a form of a film or a foil.

(1) Glasses such as quartz glass, alkali-free glass, crystallized transparent glass, PYREX glass, sapphire glass and soda-lime glass
(2) Acrylic resins such as polycarbonates and polymethyl methacrylate; vinyl chloride resins such as polyvinyl chloride and vinyl chloride copolymers; and thermoplastic resins such as polyarylates, polysulfones, polyethersulfones, polyimides, polyethylene terephthalate (PET), polyethylene naphthalate (PEN), fluorine resins, phenoxy resins, polyolefin resins, nylons, styrene resins, ABS resins and aramids
(3) Thermosetting resins such as epoxy resins
(4) Metal plates such as stainless steel plates, titanium plates, aluminum plates and copper plates
(5) The laminated mica substrate described in JP-A No. 2005-317728.

The surface of the substrate may be subjected to hydrophilizing treatment. Also, the surface of the substrate is preferably coated with a hydrophilic polymer, from the stand point of the affinity with the coating solution containing the silver salt emulsion and/or conductive fibers. By doing so, the applicability and adhesion of the coating solution containing the silver salt emulsion and/or conductive fibers to the substrate improve.

The hydrophilizing treatment is not particularly limited, and may be appropriately selected depending on the intended purpose. Examples thereof include chemical treatment, mechanical surface-roughening treatment, corona discharge treatment, flame treatment, ultraviolet treatment, glow discharge treatment, active plasma treatment and laser treatment. The surface tension of the surface of the substrate is preferably made to be 30 dyne/cm or greater by any of these hydrophilizing treatments.

The hydrophilic polymer with which the surface of the substrate is coated is not particularly limited, and may be appropriately selected depending on the intended purpose. Examples thereof include gelatins, gelatin derivatives, caseins, agars, starches, polyvinyl alcohol, polyacrylic acid copolymers, carboxymethyl cellulose, hydroxyethyl cellulose, polyvinyl pyrrolidone and dextrans. The thickness of the hydrophilic polymer layer (when dry) is preferably in the range of 0.001 μm to 100 μm, more preferably 0.01 μm to 20 μm.

The hydrophilic polymer layer is preferably increased in layer strength by the addition of a hardener, to thereby prevent softening of the hydrophilic polymer layer. The hardener is not particularly limited, and may be appropriately selected depending on the intended purpose. Examples thereof include aldehyde compounds such as formaldehyde and glutaraldehyde; ketone compounds such as diacetyl and cyclopentanedione; vinyl sulfone compounds such as divinyl sulfone; triazine compounds such as 2-hydroxy-4,6-dichloro-1,3,5-triazine; and the isocyanate compounds mentioned in U.S. Pat. No. 3,103,437.

The hydrophilic polymer layer can be formed by dissolving and/or dispersing any of the above-mentioned compounds in a solvent such as water so as to prepare a coating solution, applying the obtained coating solution over the hydrophilized substrate surface by a coating method such as spin coating, dip coating, extrusion coating, bar coating or die coating, and drying the coating solution. The drying temperature is preferably 120° C. or lower, more preferably 30° C. to 100° C., even more preferably 40° C. to 80° C.

—CIGS Solar Battery—

The structure of a CIGS (copper/indium/gallium/selenium) solar battery will be described with reference to the production method thereof.

Figure 2A:
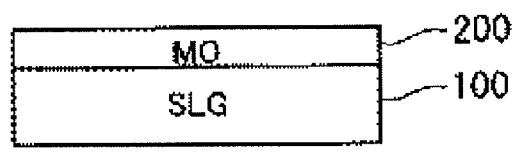
FIG. 2A to 2D are cross sectional views showing an example of a device for explaining a general method for producing cells of a CIGS thin film solar battery.
Figure 2B:
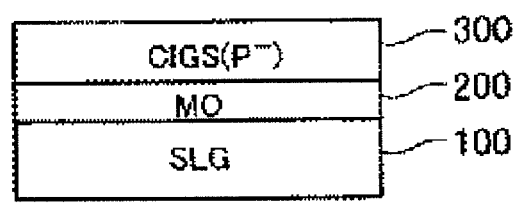
Figure 2C:
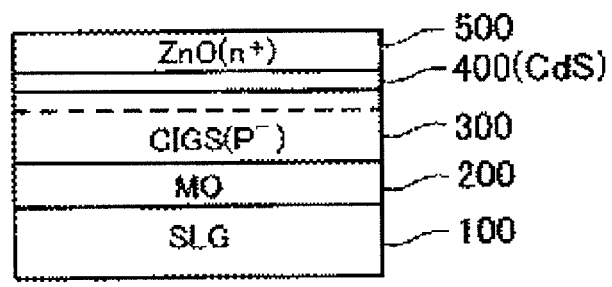
Figure 2D:
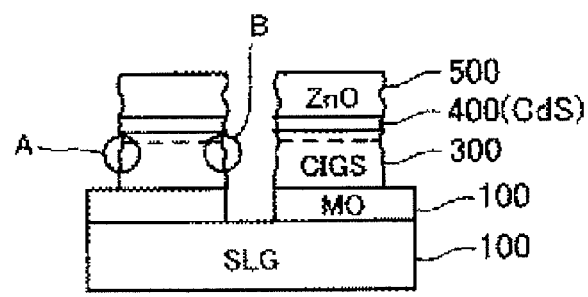

FIGS. 2A to 2D are cross-sectional views of an example of a device for explaining a general method for producing cells of a CIGS thin film solar battery. First of all, as shown in FIG. 2A, a molybdenum electrode layer (Mo electrode layer) 200 serving as a lower electrode on the positive side is formed on a substrate 100. Next, as shown in FIG. 2B, a light-absorbing layer 300 formed of a CIGS thin film, which exhibits a p⁻ type by compositional control, is formed on the Mo electrode layer 200. Then, as shown in FIG. 2C, a buffer layer 400 formed of CdS is formed on the light-absorbing layer 300, and a translucent electrode layer 500 made of zinc oxide (ZnO) as an upper electrode on the negative side, which exhibits an n⁺ type when doped with impurities, is formed on the buffer layer 400. Here, the conductive material of the present invention is laminated on ZnO or used instead of ZnO, to thereby obtain the solar battery device of the present invention. Subsequently, as shown in FIG. 2D, the translucent electrode layer 500 made of ZnO, the Mo electrode layer 200 and the layers lying between these two layers are all together scribed using a mechanical scribe device. Thus, cells of the thin film solar battery are electrically divided (in other words, the cells are separated from one another).

The following shows a typical method for forming a CIGS layer. It should, however, be noted that the formation of a CIGS layer in the present invention is not limited thereto.

(1) Multi-Source Simultaneous Vapor Deposition Method

Multi-source simultaneous vapor deposition methods are typified by the three-stage process developed by National Renewable Energy Laboratory (NREL) in USA, and the simultaneous vapor deposition method developed by EC Group. The three-stage process is described, for example, in Mat. Res. Soc. Symp. Proc., Vol. 426 (1996) p. 143 by J. R. Tuttle, J. S. Ward, A. Duda, T. A. Berens, M. A. Contreras, K. R. Ramanathan, A. L. Tennant, J. Keane, E. D. Cole, K. Emery and R. Noufi. The simultaneous vapor deposition method is described, for example, in Proc. 13th ECPVSEC (1995, Nice) 1451 by L. Stolt et al.

The three-stage process is a method of simultaneously vapor-depositing In, Ga and Se at a substrate temperature of 300° C. in high vacuum first, then simultaneously vapor-depositing Cu and Se at an increased substrate temperature of 500° C. to 560° C., and subsequently further simultaneously vapor-depositing In, Ga and Se, whereby a CIGS film with a graded band gap, whose forbidden band width varies, is obtained. The method developed by EC Group is a modified method whereby the bilayer method, in which Cu-excess CIGS is vapor-deposited at an early stage of vapor deposition and In-excess CIGS is vapor-deposited at a late stage thereof, developed by The Boeing Company can be applied to an in-line process. The bilayer method is described, for example, in IEEE Trans. Electron. Devices Vol. 37 (1990) 428 by W. E. Devaney, W. S. Chen, J. M. Stewart and R. A. Mickelsen.

The three-stage process and the simultaneous vapor deposition method by EC Group both have the following advantage: a Cu-excess CIGS film composition is employed in a film growth process, and liquid-phase sintering with a liquid-phase $Cu_{2-x}Se$ (x=0 to 1) which has undergone phase separation is utilized, so that particle diameters are enlarged and a CIGS film superior in crystallinity is thereby formed.

Nowadays, a variety of methods, in addition to these methods, are examined to improve the crystallinity of CIGS films. Note that such methods may be used as well.

(a) Method Using Ionized Gallium

This is a method of passing evaporated gallium through a grid where there are thermoelectronic ions generated by means of a filament so as to make the gallium collide with the thermal electrons, and thereby ionizing the gallium. The ionized gallium is accelerated by extraction voltage and supplied to a substrate. Details of this method are described in phys. stat. sol. (a), Vol. 203 (2006) p. 2603 by H. Miyazaki, T. Miyake, Y. Chiba, A. Yamada and M. Konagai.

(b) Method Using Cracked Selenium

This is a method in which evaporated selenium, generally in the form of a cluster, is thermally decomposed using a high-temperature heater so as to reduce molecules of the selenium cluster (68th Annual Meeting of The Japan Society of Applied Physics, Abstract of Lecture (autumn, 2007, Hokkaido Institute of Technology) 7P-L-6).

(c) Method Using Radicalized Selenium

This is a method of using selenium radicals generated by means of a bulb tracking device (54th Annual Meeting of The Japan Society of Applied Physics, Abstract of Lecture (spring, 2007, Aoyama Gakuin University) 29P-ZW-10).

(d) Method Using Photoexcitation Process

This is a method of irradiating the surface of a substrate with a KrF excimer laser (with a wavelength of 248 nm and a frequency of 100 Hz, for example) or a YAG laser (with a wavelength of 266 nm and a frequency of 10 Hz, for example) at the time of three-stage vapor deposition (54th Annual Meeting of The Japan Society of Applied Physics, Abstract of Lecture (spring, 2007, Aoyama Gakuin University) 29P-ZW-14).

(2) Selenization Method

A selenization method, also called a two-stage process, is a method of forming a metal precursor film which is a laminated layer, for example Cu layer and In layer, or (Cu—Ga) layer and In layer, by sputtering, vapor deposition, electrodeposition or the like first, then heating this metal precursor film to between approximately 450° C. and approximately 550° C. in selenium vapor or selenated hydrogen so as to produce a selenium compound such as $Cu(In_{1-x}Ga_x)Se_2$ by thermal diffusion. This method is specifically called a gas-phase selenization method. Apart from the gas-phase selenization method, there is a solid-phase selenization method in which solid-phase selenium is deposited over a metal precursor film and selenization is effected by solid-phase diffusion reaction using this solid-phase selenium as a selenium source. At present, the only successful method for mass production with area enlargement is a method of forming a metal precursor film by a sputtering method suitable for area enlargement and selenating this metal precursor film in selenated hydrogen.

However, this method presents the following problems: there is approximately twofold volume expansion of the film at the time of selenization, so that internal distortion is caused; moreover, voids which are several micrometers or so in size are formed in the film produced, and these voids have adverse effects on the adhesion of the film to a substrate and solar battery properties, thereby limiting photoelectric conversion efficiency (NREL/SNL Photovoltaics Prog. Rev. Proc. 14th Conf.-A Joint Meeting (1996) AIP Conf. Proc. 394 by B. M. Basol, V. K. Kapur, C. R. Leidholm, R. Roe, A. Halani and G. Norsworthy).

To avoid such rapid volume expansion occurring at the time of selenization, there have been proposed a method of mixing selenium into a metal precursor film beforehand at a certain proportion (as described in "$CuInSe_2$-Based Solar Cells by Se-Vapor Selenization from Se-Containing Precursors" Solar Energy Materials and Solar Cells Vol. 35 (1994) p. 204-214 by T. Nakada, R. Ohnishi and A. kunioka); and use of a multilayered precursor film in which selenium is sandwiched between thin metal layers (for example, the structure of Cu layer/In layer/Se layer is repeatedly stacked) (as described in "Thin Films of $CuInSe_2$ Produced by Thermal Annealing of Multilayers with Ultra-Thin stacked Elemental Layers" Proc. of 10th European Photovoltaic Solar Energy Conference (1991) p. 887-890 by T. Nakada, K. Yuda and A. Kunioka). By the foregoing, the problem of volume expansion can be avoided to some extent.

However, all selenization methods including these methods have the following problem in common: a metal laminated film with a predetermined composition is used, and this metal laminated film is selenated, so that there is a very low degree of freedom in term of control of the film composition. For example, at present a high-efficiency CIGS solar battery employs a CIGS thin film with a graded band gap, whose gallium concentration varies with respect to the film thickness direction; to produce this thin film by selenization, there is a method of depositing a Cu—Ga alloy film first, then depositing an indium film over the Cu—Ga alloy film, and allowing the gallium concentration to vary with respect to the film thickness direction by utilizing natural thermal diffusion when these films are selenated (refer to Tech. Digest 9th Photovoltaic Science and Engineering Conf. Miyazaki, 1996 (Intn. PVSEC-9, Tokyo, 1996) p. 149 by K. Kushiya, I. Sugiyama, M. Tachiyuki, T. Kase, Y. Nagoya, O. Okumura, M. Sato, O. Yamase and H. Takeshita).

(3) Sputtering Method

The sputtering method is suitable for area enlargement, so that many procedures have hitherto been attempted as $CuInSe_2$ thin film forming procedures. For instance, there have been disclosed a method in which $CuInSe_2$ polycrystals are targeted, and a two-source sputtering method in which $Cu_2Se$ and $In_2Se_3$ are targeted and a mixed gas of $H_2Se$ and Ar is used as a sputter gas (refer to "CdS/CuInSe$_2$ Junctions Fabricated by DC Magnetron Sputtering of Cu$_2$Se and In$_2$Se$_3$," Proc. 18th IEEE Photovoltaic Specialists Conf. (1985) 1655-1658 by J. H. Ermer, R. B. Love, A. K. Khanna, S. C. Lewis and F. Cohen). Also, a three-source sputtering method, in which sputtering is performed using a Cu target, an In target and a Se or CuSe target in Ar gas, and the like have been reported (refer to "Polycrystalline CuInSe$_2$ Thin Films for Solar Cells by Three-Source Magnetron Sputtering" Jpn. J. Appl. Phys. Vol. 32 (1993) p. L1169-L1172 by T. Nakada, K. Migita and A. Kunioka; and "CuInSe$_2$ Films for Solar Cells by Multi-Source Sputtering of Cu, In and Se—Cu Binary Alloy" Proc. 4th Photovoltaic Science and Engineering Conf. (1989) p. 371-375 by T. Nakada, M. Nishioka and A. Kunioka).

(4) Hybrid Sputtering Method

Assuming that a problem with the sputtering method is damage to the film surface caused by selenium negative ions or high-energy selenium particles, it must be possible to avoid this problem by subjecting only the selenium to thermal evaporation, not the sputtering. Nakada et al. formed a CIS thin film with fewer defects in accordance with a hybrid sputtering method, in which Cu and In are subjected to direct-current sputtering and selenium alone is subjected to vapor deposition, and thereby producing a CIS solar battery with a conversion efficiency of over 10% (refer to "Microstructural Characterization for Sputter-Deposited CuInSe$_2$ Films and Photovoltaic Devices" Jpn. Appl. Phys. Vol. 34 (1995) p. 4715-4721 by T. Nakada, K. Migita, S, Niki and A. Kunioka). Prior to the foregoing, Rockett et al. reported a hybrid sputtering method oriented to the use of selenium steam instead of H$_2$Se gas that is poisonous (Proc. 20th IEEE Photovoltaic Specialists Conf. (1988) p. 1505 by A. Rockett, T. C. Lommasson, L. C. Yang, H. Talieh, P. Campos and J. A. Thornton). Even earlier, there was reported a method of performing sputtering in selenium steam to compensate for a deficiency of selenium in a film (Jpn. J. Appl. Phys. 19 (Suppl. 19-3) (1980) p. 23 by S. Isomura, H. Kaneko, S. Tomioka, I. Nakatani and K. Masumoto).

(5) Mechanochemical Process

Raw materials in the composition of CIGS are placed in a container of a planetary ball mill, and the raw materials are mixed together with mechanical energy so as to obtain CIGS powder. Thereafter, the CIGS powder is applied over a substrate by screen printing, which is followed by annealing, to thereby obtain a CIGS film (Phys. stat. sol. (a), Vol. 203 (2006) p. 2593 by T. Wada, Y. Matsuo, S, Nomura, Y. Nakamura, A. Miyamura, Y. Chia, A. Yamada and M. Konagai).

(6) Other Methods

Examples of other CIGS film forming methods include screen printing, close-spaced sublimation, MOCVD and spraying. A thin film composed of a group Ib element, a group IIIb element, a group VIb element and fine particles of compounds of these elements is formed over a substrate by screen printing, spraying, etc., and then the thin film is, for example, heat-treated, if necessary in an atmosphere of a group VIb element, so as to obtain crystals with a desired composition. For instance, a thin film is formed by applying fine oxide particles, then the thin film is heated in an atmosphere of selenated hydrogen. A thin film of an organic metal compound containing PVSEC-17 PL5-3 or a metal—group VIb element bond is formed on a substrate by spraying, printing, etc. and the thin film is thermally decomposed so as to obtain a desired thin inorganic film. When sulfur is used, examples of usable compounds include metal mercaptides, thioacid salts of metals, dithioacid salts of metals, thiocarbonate salts of metals, dithiocarbonate salts of metals, trithiocarbonate salts of metals, thiocarbamic acid salts of metals and dithiocarbamic acid salts of metals (refer to JP-A Nos. 09-74065 and 09-74213).

—Value of Bang Gap and Control of Distribution—

Figure 3:
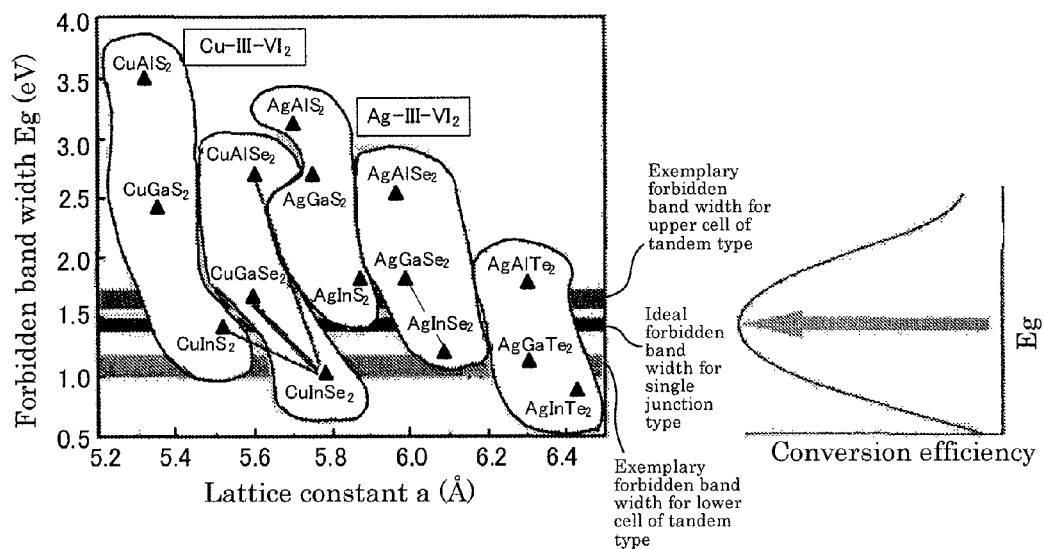
FIG. 3 is a drawing showing the relationship between lattice constants and band gaps regarding semiconductors each containing a group Ib element, a group IIIb element and a group VIb element.

As the light-absorbing layer of the solar battery, a semiconductor containing a combination of a group I element, a group III element and a group VI element can be favorably used. Well-known semiconductors containing combinations such as this are shown in FIG. 3. FIG. 3 is a drawing showing the relationship between lattice constants and band gaps regarding semiconductors each containing a group Ib element, a group IIIb element and a group VIb element. Cu(In$_{1-x}$Ga$_x$)Se$_2$(CIGS) is mixed crystals of CuInSe$_2$ and CuGaSe$_2$. The forbidden band width can be controlled between 1.04 eV and 1.68 eV by changing the Ga concentration x. Other mixed crystals include Cu(In,Al)Se$_2$, Ag(In,Ga)Se$_2$, CuIn(S,Se)$_2$ and AgIn(S,Se)$_2$. By changing compositional ratios, a variety of forbidden band widths (band gaps) can be obtained. When photons with energy which is greater than the energy of a band gap enter a semiconductor, the amount of energy which exceeds the energy of the band gap results in heat loss. It is known from a theoretical calculation that, regarding the spectrum of sunlight and a band gap, the greatest conversion efficiency can be yielded when the band gap is in the approximate range of 1.4 eV to 1.5 eV. In order to enhance the conversion efficiency of a CIGS solar battery, the gallium concentration of Cu(In$_x$Ga$_{1-x}$)S$_2$, the aluminum concentration of Cu(In$_x$Al$_x$)S$_2$ or the sulfur concentration of CuInGa (S,Se), for example, is increased so as to enlarge the band gap; by doing so, a band gap for high conversion efficiency is obtained. In the case of Cu(In$_x$Ga$_{1-x}$)S$_2$, the band gap may be adjusted to the range of 1 eV to 1.68 eV.

Also, it is possible to add a gradient to a band structure by changing the compositional ratio with respect to the film thickness direction. There are two types of band gaps that can be thought of; a single graded band gap in which the band gap is increased from the light incidence window side toward an electrode on the opposite side; and a double graded band gap in which the band gap is decreased from the light incidence window side toward a p-n junction and the band gap is increased past the p-n junction. Solar batteries employing such band structures are disclosed, for example, in "A new approach to high-efficiency solar cells by band gap grading in Cu(In,Ga)Se$_2$ chalcopyrite semiconductors, Solar Energy Materials & Solar Cells, Vol. 67, p. 145-150 (2001) by T. Dullweber". In each case, due to the electric field generated on the inside by the gradient of the band structure, light-induced carriers are accelerated and easily reach an electrode, and the probability of combination of the carriers and a recombination center is decreased, thereby improving power generation efficiency (refer to International Publication No. WO 2004/090995).

—Tandem Type—

When a plurality of semiconductors with different band gaps corresponding to ranges of a spectrum are used, it is possible to reduce heat loss caused by the discrepancy between photon energy and a band gap and improve power generation efficiency. A device in which such a plurality of photoelectric conversion layers are used in combination is called a tandem type. In the case of a two-layer tandem type, employment of a combination of a band gap of 1.1 eV and a band gap of 1.7 eV makes it possible to improve power generation efficiency.

—Components Other than Photoelectric Conversion Layer—

Components other than photoelectric conversion layer is not particularly limited, and may be appropriately selected depending on the intended purpose. For n-type semiconductors which form junctions with I-III-VI compound semiconductors, II-VI compounds such as CdS, ZnO, ZnS and Zn(O, S, OH) can be used. These compounds are preferable in that junction interfaces with photoelectric conversion layers can be formed without causing carrier recombination (refer to JP-A No. 2002-343987).

[Back Electrode]

A back electrode is not particularly limited, and may be appropriately selected depending on the intended purpose. A metal such as molybdenum, chromium or tungsten can be used as the back electrode. These metal materials are preferable in that they do not easily mix with other layers even when heat treatment is carried out. Use of a molybdenum layer is preferable in the case where a photovoltaic layer including a semiconductor layer (light-absorbing layer) formed of a I-III-VI compound semiconductor is used. At the boundary surface between the light-absorbing layer (CIGS) and the back electrode, there exists a recombination center. Thus, when the connection area between the back electrode and the light-absorbing layer is larger than the area necessary for electrical conductivity, there is a decrease in power generation efficiency. To reduce the connection area, use of an electrode layer with a structure in which insulating material and metal are disposed in the form of stripes is favorable (refer to JP-A No. 09-219530).

The layer structure of the back electrode is not particularly limited, and may be appropriately selected depending on the intended purpose. Examples of layer structures include superstrate-type structures and substrate-type structures. In the case where a photovoltaic layer including a semiconductor layer (light-absorbing layer) formed of a I-III-VI compound semiconductor is used, employment of a substrate-type structure is preferable in that high conversion efficiency can be obtained.

[Buffer Layer]

A buffer layer is not particularly limited, and may be appropriately selected depending on the intended purpose. For example, for the buffer layer, CdS, ZnS, ZnS(O, OH), ZnMgO or the like can be used. For instance, when the band gap of the light-absorbing layer is widened by increasing the gallium concentration of CIGS, its conduction band becomes far larger than the conduction band of ZnO; therefore, ZnMgO that has great conduction band energy is preferable for the buffer layer.

EXAMPLES

The present invention will be specifically explained with reference to Examples and Comparative Examples. However, it should be noted that the scope of the present invention is not confined to these Examples.

In Examples below, the diameter (minor axis length) and major axis length of a metal nanowire, the diameter (minor axis length) variation coefficient of the metal nanowires, the appropriate wire formation rate, and the sharpness of cross-sectional corners of the metal nanowire were measured as follows.

<Diameter (Minor Axis Length) and Major Axis Length of Metal Nanowires>

Three hundred metal nanowires were observed using a transmission electron microscope (TEM; JEM-2000FX, manufactured by JEOL Ltd.), and the diameter (minor axis length) and major axis length of metal nanowires were calculated by averaging the diameters (minor axis lengths) and major axis lengths of these 300 metal nanowires.

<Variation Coefficient of Diameter (Minor Axis Length) of Metal Nanowires>

The diameter variation coefficient of the metal nanowires was worked out by observing 300 metal nanowires with the use of a transmission electron microscope (TEM; JEM-2000FX, manufactured by JEOL Ltd.), measuring the diameters (minor axis lengths) of these 300 metal nanowires, and calculating the standard deviation and average value of the diameters (minor axis lengths).

<Appropriate Wire Formation Rate>

A silver nanowire aqueous dispersion liquid was filtered so as to separate silver nanowires from particles which were not the silver nanowires. Then the amount of silver remaining on filter paper and the amount of silver which had passed through the filter paper were measured using an ICP emission analyzer (ICPS-8000, manufactured by SHIMADZU CORPORATION) so as to calculate the metal amount (% by mass) of metal nanowires (appropriate wires) which were 50 nm or less in diameter (minor axis length) and 5 μm or greater in major axis length contained in all metal particles. The separation of the appropriate wires in calculating the appropriate wire formation rate was performed using a membrane filter (FALP 02500, pore diameter: 1.0 μm, manufactured by Millipore Corporation).

<Sharpness of Cross-sectional Corners of Metal Nanowires>

As for the cross-sectional shape of each metal nanowire, a metal nanowire aqueous dispersion liquid was applied over a base material, and a cross section of the base material coated with the dispersion liquid was observed using a transmission electron microscope (TEM; JEM-2000FX, manufactured by JEOL Ltd.). Three hundred metal nanowires were selected, and the cross-sectional outer circumference and the total length of the cross-sectional sides were measured regarding each of these 300 metal nanowires so as to calculate the sharpness, i.e. the proportion of the "cross-sectional outer circumference" to the total length of the "cross-sectional sides". When the sharpness was 75% or less, the cross-sectional shape was defined as a cross-sectional shape with round corners.

Preparation of Sample No. 101

Preparation of Emulsion A

To a solution 1 maintained at 38° C. and pH 4.5, a solution 2 and a solution 3 were respectively added for 20 minutes while stirring, to form a core particle having a diameter of 0.16 μm. The amount of each solution 2 and solution 3 used was 90% by mass of the total amount of each solution.

Solution 1

| Water | 750 mL |
|---|---|
| Gelatin (phthalated gelatin) | 8 g |
| Sodium chloride | 3 g |
| 1,3-dimethylimidazolidine-2-thione | 20 mg |
| Sodium benzenethiosulfonate | 10 mg |
| Citric acid | 0.7 g |

Solution 2

| Water | 300 mL |
|---|---|
| Silver nitrate | 150 g |

Solution 3

|  |  |
|---|---|
| Water | 300 mL |
| Sodium chloride | 38 g |
| Potassium bromide | 32 g |
| Potassium hexachloroiridate(III) (0.005% KCl, 20% aqueous solution) | 5 mL |
| Ammonium hexachlororhodate (0.001% NaCl, 20% aqueous solution) | 7 mL |

The potassium hexachloroiridate(III) (0.005% KCl, 20% aqueous solution) and the ammonium hexachlororhodate (0.001% NaCl, 20% aqueous solution) used in the solution 3 were prepared by dissolving complex powders thereof respectively in 20% KCl aqueous solution and 20% NaCl aqueous solution, and heating at 40° C. for 120 minutes.

Subsequently, a solution 4 and solution 5 were added to the resultant liquid for 8 minutes, and the rest of the solution 2 and the solution 3 (10% of the total amount of each solution 2 and the solution 3) were respectively added to the mixture liquid for 2 minutes, so as to grow a particle to have a diameter of 0.21 μm. Additionally, 0.15 g of potassium iodide was added to the mixture liquid, and matured for 5 minutes, to thereby complete particle formation.

Solution 4

|  |  |
|---|---|
| Water | 100 mL |
| Silver nitrate | 50 g |

Solution 5

|  |  |
|---|---|
| Water | 100 mL |
| Sodium chloride | 13 g |
| Potassium bromide | 11 g |
| Yellow prussiate of potash | 5 mg |

Thereafter, the obtained particles were washed with water by a flocculation method according to a standard method. Specifically, temperature was cooled down to 35° C., and pH was decreased using sulfuric acid until the silver halide precipitated (the pH was in the range of 3.6±0.2).

Next, approximately 3 L of the supernatant was removed (first water washing). Distilled water (3 L) was further added to the mixture, and then sulfuric acid was added thereto until silver halide precipitated. Moreover, 3 L of the supernatant was removed (second water washing). The operation of the second water washing was repeated once more (third water washing), and water-washing and desalting steps were thus completed.

After the water-washing and desalting, the pH and the pAg of the emulsion were adjusted to 6.4 and 7.5, respectively. To the emulsion, the following components were added at 55° C., and was subjected to chemical sensitization.

|  |  |
|---|---|
| Sodium benzenethiosulfonate | 10 mg |
| Sodium benzenethiosulfinate | 3 mg |
| Sodium thiosulfate | 15 mg |
| Chlorauric acid | 10 mg |

Thereafter, to the solution which had been subjected to chemical sensitization, 100 mg of 1,3,3a,7-tetrazaindene as a stabilizer, and 100 mg of PROXEL (product name, manufactured by ICI Co., Ltd.) as an antiseptic agent were added. Finally, a silver iodochlorobromide cubic particle-containing emulsion A, which contained 70 mol % of silver chloride and 0.08 mol % of silver iodide and had an average particle size of 0.22 μm and a variation coefficient of 9%, was obtained. The final emulsion had a pH of 6.4, a pAg of 7.5, an electrical conductivity of 40 μS/m, a density of $1.2 \times 10^{-3}$ kg/m$^3$, and a viscosity of 60 mPa·s.

(Preparation of Coating Solution A)

To the emulsion A, $5.7 \times 10^{-4}$ mol/mol Ag of a sensitizing dye (SD-1) represented by the structural formula below was added so as to perform spectral sensitization. Moreover, $3.4 \times 10^{-4}$ mol/mol Ag of KBr and $8.0 \times 10^{-4}$ mol/mol Ag of a compound (Cpd-3) represented by the structural formula below were added to the mixture and sufficiently mixed.

Next, the following components were added to the resultant mixture, and pH thereof was adjusted to 5.6 using citric acid, to thereby produce a coating solution A.

|  |  |
|---|---|
| 1,3,3a,7-tetraazaindene | $1.2 \times 10^{-4}$ mol/mol Ag |
| Hydroquinone | $1.2 \times 10^{-2}$ mol/mol Ag |
| Citric acid | $3.0 \times 10^{-4}$ mol/mol Ag |
| 2,4-dichloro-6-hydroxy-1,3,5-triazine sodium salt | 90 mg/m$^2$ |
| Colloidal silica having a particle size of 10 μm | 15% by mass relative to the gelatin |
| Aqueous latex (aqL-6) represented by the structural formula below | 50 mg/m$^2$ |
| Polyethylacrylate latex | 100 mg/m$^2$ |
| A latex copolymer of methyl acrylate, sodium 2-acrylamido-2-methylpropanesulfonate, and 2-acetoxyethyl methacrylate (ratios by mass 88:5:7) | 100 mg/m$^2$ |
| A core-shell latex A core-shell type latex (core: styrene/butadiene copolymer (ratio by mass 37/63), shell: styrene/2-acetoxyethyl acrylate (ratio by mass 84/16), core/shell ratio = 50/50) | 100 mg/m$^2$ |
| A compound (Cpd-7) represented by the structural formula below | 4% by mass relative to the gelatin |

SD-1

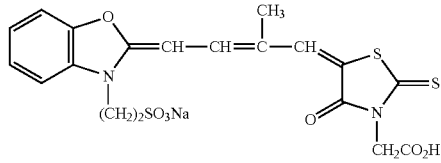

Cpd-3

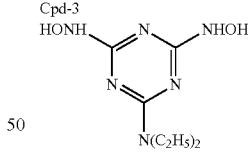

aqL-6

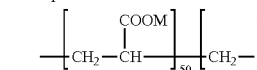

Cpd-7

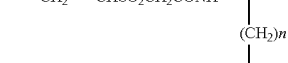

(n = 2):(n = 3) = 3:1

(Undercoating Layer)

As a support, polyethylene terephthalate (PET), which surface had been hydrophilized, and had a thickness of 100 μm, was used, and on the support an undercoating layer was formed in the following manner. Specifically, a coating solution was prepared in the same manner as in the emulsion A, except that the amount of gelatin contained in the solution 1 used for preparation of the emulsion A was changed to 20 g, and then the coating solution was applied to the support so that the amount of the gelatin would be 0.10 g/m$^2$, to thereby form an undercoating layer.

(Silver Halide Emulsion Layer)

The thus prepared coating solution A was applied to the undercoating layer, so that the amounts of Ag and gelatin respectively became 4.5 g/m$^2$, and 0.25 g/m$^2$, to thereby form a silver halide emulsion layer. Thus, Sample No. 101, in which the undercoating layer and the silver halide emulsion layer were formed over the support, was obtained.

Preparation of Sample No. 102

Preparation of Silver Nanowire Dispersion

Preparation of Silver Nanowire Dispersion (1)

The following additive solutions A, G and H were prepared in advance.
[Additive Solution A]

In 50 mL of pure water, 0.51 g of silver nitrate powder was dissolved. Thereafter, 1N ammonia water was added until the solution became transparent. Then pure water was added such that the total amount became 100 mL.
[Additive Solution G]

In 140 mL of pure water, 0.5 g of glucose powder was dissolved so as to prepare an additive solution G.
[Additive Solution H]

In 27.5 mL of pure water, 0.5 g of HTAB (hexadecyltrimethylammonium bromide) powder was dissolved so as to prepare an additive solution H.

Next, a silver nanowire aqueous dispersion liquid was prepared in the following manner. Into a three-necked flask, 410 mL of pure water was poured, then 82.5 mL of the additive solution H and 206 mL of the additive solution G were added at 20° C. while agitating, using a funnel (first stage). To the obtained solution, 206 mL of the additive solution A was added at a flow rate of 2.0 mL/min and an agitation rotational speed of 800 rpm (second stage). Ten minutes afterward, 82.5 mL of the additive solution H was added (third stage). Thereafter, the internal temperature was increased to 75° C. at a rate of 3° C./min. After that, the agitation rotational speed was lowered to 200 rpm, and heating was carried out for 5 hours.

The obtained aqueous dispersion was cooled, then the ultrafiltration module SIP1013 (molecular cutoff: 6,000, manufactured by Asahi Kasei Corporation), a magnet pump and a stainless steel cup were connected by a silicone tube to constitute an ultrafiltration apparatus. The aqueous dispersion was poured into the stainless steel cup, then ultrafiltration was performed by operating the pump. When the amount of filtrate coming from the module stood at 50 mL, 950 mL of distilled water was poured into the stainless steel cup to carry out washing. The washing was repeated until the conductivity became equal to or lower than 50 μS/cm, then concentration was carried out, and a silver nanowire dispersion (1) was thus obtained.

The silver nanowires contained in the silver nanowire dispersion (1) were wire-shaped and had an average diameter of 18 nm, average major axis length of 38 μm. The silver nanowires had a diameter variation coefficient of 22.4%, an appropriate wire formation rate of 78.7%, and a sharpness of cross-sectional corners of 44.1.

The silver nanowire dispersion was mixed with the coating solution A used in Sample No. 101, and applied in the same manner as in Sample No. 101, so that the dry coated amount of the silver nanowires would be 0.03 g/m$^2$, to thereby obtain Sample No. 102.

Preparation of Sample No. 103 to 106

Sample Nos. 103 to 106 were obtained by mixing the silver nanowire dispersion with the coating solution A used in Sample No. 101, and applying the resultant mixture in the same manner as in Sample No. 101, so that the dry coated amount of the silver nanowires would be respectively 0.003 g/m$^2$, 0.007 g/m$^2$, 0.16 g/m$^2$, and 0.24 g/m$^2$.

Preparation of Sample No. 107

Preparation of Composition for Conductive Layer

The silver nanowire dispersion (1) and gelatin were mixed with water so that mass ratio of the silver nanowire dispersion (1) and gelatin would be 1:1 in the dry solid content, to thereby prepare a composition for a conductive layer.

On a support, an undercoating layer and a silver halide emulsion layer were provided in the same manner as in Sample No. 101, the composition for a conductive layer prepared as described above was applied over the support, and dried, so that the dry coated amount of the silver nanowires after drying would be 0.03 g/m$^2$, to thereby obtain Sample No. 107.

Preparation of Sample No. 108 to 111

The silver nanowire dispersion was mixed and applied in the same manner as in Sample No. 107, so that the dry coated amount of the silver nanowires after drying would be 0.003 g/m$^2$, 0.007 g/m$^2$, 0.16 g/m$^2$, and 0.24 g/m$^2$, to thereby respectively obtain sample Nos. 108 to 111.

Preparation of Sample No. 112

On a support, an undercoating layer is provided in the same manner as in Sample No. 101, and the composition for a conductive layer prepared as described above was applied over the support, and dried, so that the dry coated amount of the silver nanowires would be 0.03 g/m$^2$, to thereby form a conductive layer. Then, a silver halide emulsion layer was formed on the conductive layer in the same manner as in Sample No. 101, to thereby obtain Sample No. 112.

Preparation of Sample No. 113

Sample No. 113 was obtained by preparing in the same manner as in Sample No. 107, except that the silver nanowire dispersion (1) was replaced by a silver nanowire dispersion (2) prepared in the following manner.

Preparation of Silver Nanowire Dispersion (2)

Into a three-necked flask, 30 mL of ethylene glycol was poured, and then heated at 160° C. Thereafter, 36 mM of polyvinyl pyrrolidone (K-55), 3 μM of iron acetylacetonate, 18 mL of ethylene glycol solution containing 60 μM of sodium chloride and 18 mL of ethylene glycol solution containing 24 mM of silver nitrate were added at a rate of 1 mL/min. The mixed solution was heated at 160° C. for 60 minutes and then cooled to room temperature. The mixed solution was centrifuged with the addition of water, then refinement was carried out until the conductivity became equal to or lower than 50 μS/cm, and an aqueous dispersion of the silver nano particles was thus obtained.

The obtained silver nanowires were wire-shaped and had an average diameter of 110 nm, and an average major axis length of 32 μm. The obtained silver nanowires had a diameter variation coefficient of 86.1%, an appropriate wire formation rate of 75.6%, and a sharpness of cross-sectional corners of 45.3.

The aqueous dispersion of silver nanowires was centrifuged, then water was removed by decantation, pure water was added, and then redispersion was performed. This process was repeated three times, and a silver nanowire dispersion (2) was thus obtained. The amount of the silver in the dispersion solution was 1.2% by mass.

Preparation of Sample No. 114

Sample No. 114 was obtained in the same manner as in Sample No. 107, except that conductive oxide fine particles (SN-100P, manufactured by ISHIHARA SANGYO KAISHA, LTD.) were further added in the composition for a conductive layer, so that the dry coated amount of the conductive oxide fine particles would be 0.2 g/m².

Preparation of Sample No. 115

Sample No. 115 was obtained in the same manner as in Sample No. 107, except that single wall carbon nanotubes produced in the following manner was used instead of the silver nanowire dispersion (1) used for preparation of the composition for a conductive layer.

Preparation of Single Wall Carbon Nanotubes

With reference to the procedure of Example 1 described in Japanese Patent (JP-B) No. 3903159, a single wall carbon nanotube dispersion liquid was prepared. Specifically, single wall carbon nanotubes (synthesized referring to the literature Chemical Physics Letters, Vol. 323 (2000) pp. 580-585) and a polyoxyethylene-polyoxypropylene copolymer as a dispersing agent were added to an isopropyl alcohol/water (mixing ratio of 3:1) mixture as a solvent. The carbon nanotube content and the dispersion content were 0.003% by mass and 0.05% by mass, respectively. The obtained carbon nanotubes had a major axis length of 1 μm to 3 μm, and a minor axis length of 1 nm to 2 nm, and an aspect ratio of 1,000 to 1,500.

Preparation of Sample Nos. 116 to 119

Sample Nos. 116 to 119 were obtained in the same manner as in Sample No. 102, except that the coated amount of the coating solution A was adjusted so that the dry amount of the silver would be 0.8 g/m², 1.4 g/m², 6.8 g/m², and 8.4 g/m².

Preparation of Sample Nos. 201 to 219

Exposing and Developing Process

Next, Sample Nos. 101 to 119 prepared as described above were each exposed to parallel light from a high-pressure mercury lamp as a light source through a grid-shaped photomask (specifically, a photomask having a grid-shaped space with line/space=295 μm/5 μm and with a pitch of 300 μm) capable of forming a developed silver image with line/space=5 μm/295 μm. The resultant was developed with the following developing solution, further treated using a fixing solution (product name: N3X-R for CN16X, manufactured by FUJIFILM Corporation), and rinsed with pure water, followed by calender processing to thereby obtain Sample Nos. 201 to 219.

[Composition of Developing Liquid]

In 1 L of a developing solution, the following compounds were contained.

| Hydroquinone | 0.037 mol/L |
|---|---|
| N-methylaminophenol | 0.016 mol/L |
| Sodium metaborate | 0.140 mol/L |
| Sodium hydroxide | 0.360 mol/L |
| Sodium bromide | 0.031 mol/L |
| Potassium metabisulfite | 0.187 mol/L |

(Calender Process)

Each sample which had been developed as described above, was calender processed. A calendering roller was a metal roller, which formed of a hard chromium plated iron core and had a diameter of 250 mm, and the sample was passed between the rollers with a linear pressure of 400 kgf/cm.

Preparation of Sample Nos. 220 to 223

Sample No. 220

On Sample No. 207, which had been calender processed, an ITO conductive layer having a thickness of 200 nm was formed by sputtering, to thereby obtain Sample No. 220.

Sample No. 221

A photosensitive material was produced in the same manner as in Sample No. 114, except that the silver nanowire dispersion (1) was not used, and then the photosensitive material was exposed, developed, calendar processed, and an ITO conductive layer was formed thereon, to thereby produce Sample No. 221.

Sample No. 222

Sample No. 222 was produced in the same manner as in Sample No. 107, except that the silver nanowire dispersion (1) was not used in preparation of the composition for a conductive layer of Sample No. 107 used for preparation of Sample No. 220.

Sample No. 223

Sample No. 223 was produced in the same manner as in Sample No. 207, except that the viscosity and surface tension of each of the coating solution A and the composition for the conductive layer, which were used for formation of the silver halide emulsion layer and the conductive layer, were adjusted, and the silver halide emulsion layer and the conductive layer were formed by applying solutions thereof simultaneously in the preparation of Sample No. 107 used in preparation of Sample No. 207.

Preparation of Sample No. 224

Transparent Auxiliary Electrode Film

With reference to Examples of JP-A No. 2009-146747, Comparative Sample No. 224 was produced as follows.
[Formation of First Auxiliary Electrode—Grid-Shaped Metal Auxiliary Electrode—]

Preparation of Silver Halide Emulsion

In a reaction vessel, the following Solution A was maintained at 34° C. in a reaction vessel while stirring at high speed by use of a mixing stirrer described in JP-A No. 62-160128, and the pH was adjusted to 2.95 with nitric acid (concentration: 6%). The following Solution B and Solution C were added to Solution A at a constant flow rate for 8 minutes and 6 seconds by a double jet method. Thereafter, pH of the resultant mixture was adjusted to 5.90 using sodium carbonate (concentration: 5%), and the following Solutions D and E were added to the resultant mixture.
Solution A

| Alkali processed inactive gelatin (average molecular mass 100,000) | 18.7 g |
| Sodium chloride | 0.31 g |
| Solution I described below | 1.59 mL |
| Pure water | 1,246 mL |

Solution B

| Silver nitrate | 169.9 g |
| Nitric acid (concentration 6%) | 5.89 mL |
| Pure water | Balance (the total amount of the solution B was 317.1 mL) |

Solution C

| Alkali processed inactive gelatin (average molecular mass 100,000) | 5.66 g |
| Sodium chloride | 58.8 g |
| Potassium bromide | 13.3 g |
| Solution I described below | 0.85 mL |
| Solution II described below | 2.72 mL |
| Pure water | Balance (the total amount of the solution C was 317.1 mL) |

Solution D

| 2-methyl-4 hydroxy-1,3,3a,7-tetraazaindene | 0.56 g |
| Pure water | 112.1 mL |

Solution E

| Alkali processed inactive gelatin (average molecular mass 100,000) | 3.96 g |
| Solution I described below | 0.40 mL |
| Pure water | 128.5 mL |

Solution I
Surfactant: sodium polyisopropylene-polyethylene-oxydisuccinate (10% by mass of methanol solution)
Solution II
Rhodium hexachloride complex (10% by mass of aqueous solution)

After the above process was completed, the resultant solution was desalted and washed with water at 40° C. by flocculation according to a standard method, and Solution F and an antifungal agent were added thereto, and sufficiently dispersed at 60° C., followed by adjusting pH to 5.90 at 40° C., to thereby obtain a silver chlorobromide cubic particle emulsion containing 10 mol % of silver bromide and having an average particle size of 0.09 μm and a variation coefficient of 10%.
Solution F

| Alkali processed inactive gelatin (average molecular mass 100,000) | 16.5 g |
| Pure water | 139.8 mL |

The silver chlorobromide cubic particle emulsion was subjected to chemical sensitization at 40° C. for 80 minutes using 20 mg of sodium thiosulfate per mole of silver halide, and after the chemical sensitization was completed, 500 mg of 4-hydroxy-6-methyl-1,3,3a,7-tetrazaindene (TAI) per mole of silver halide and 150 mg of 1-phenyl-5-mercaptotetrazole per mole of silver halide were added to the emulsion, to thereby obtain a silver halide emulsion. In the silver halide emulsion, a volume ratio of the silver halide particle to the gelatin (silver halide particle/gelatin) was 0.625.
[Coating]
Moreover, a hardener (H-1: tetrakis(vinylsulfonylmethyl)methane) was added to gelatin in an amount of 200 mg relative to 1 g of gelatin, and as a coating auxiliary a surfactant (SU-2: sodium di(2-ethylhexyl)sulfosuccinate) was further added, so as to adjust a surface tension.

The thus obtained coating solution was applied to a base material of a polyethylene terephthalate (PET) film, on which an undercoating layer was formed, having a thickness of 100 μm and transmittance of 92% (back surface thereof was subjected to antireflection treatment), so that the amount of the silver coated on the undercoating layer became 0.625 g/m$^2$, and the coated film was cured at 50° C. for 24 hours, to thereby obtain a photosensitive material.
[Exposing]
The obtained photosensitive material was exposed via the mesh photomask (L/S=5 μm/295 μm) with a UV exposure device.
[Chemical Development]
The exposed photosensitive material was developed at 25° C. for 60 seconds using the following developing solution (DEV-1), and then fixed at 25° C. for 120 seconds using the following fixing solution (FIX-1).
(DEV-1)

| Pure water | 500 mL |
| METOL | 2 g |
| Sodium sulfite anhydrous | 80 g |
| Hydroquinone | 4 g |
| Borax | 4 g |
| Sodium thiosulfate | 10 g |
| Potassium bromide | 0.5 g |
| Water | Balance (the total amount of the DEV-1 was 1 L) |

(FIX-1)

| | |
|---|---|
| Pure water | 750 mL |
| Sodium thiosulfate | 250 g |
| Sodium sulfite anhydrous | 15 g |
| Glacial acetic acid | 15 mL |
| Potassium alum | 15 g |
| Water | Balance (the total amount of the FIX-1 was 1 L) |

[Physical Development]

Next, physical development was performed using the following physical developing solution (PDEV-1) at 30° C. for 10 minutes, and then washing was performed using running tap water for 10 minutes.
(PDEV-1)

| | |
|---|---|
| Pure water | 900 mL |
| Citric acid | 10 g |
| Trisodium citrate | 1 g |
| Ammonia water (28%) | 1.5 g |
| Hydroquinone | 2.3 g |
| Silver nitrate | 0.23 g |
| Water | Balance (the total amount of the PDEV-1 was 1,000 mL) |

[Electrolytic Plating]

After the physical development, electrolytic copper plating was performed at 25° C. using the following electrolytic plating solution, followed by washing and drying. The current control in the electrolytic copper plating was performed for 13 minutes in total, specifically, at 3A for 1 minute and at 1A for 12 minutes. After the electrolytic copper plating was completed, washing was performed using running tap water for 10 minutes, followed by drying using dry air (50° C.) to thereby achieve the drying state.
(Electrolytic Plating Solution)

| | |
|---|---|
| Copper sulfate (pentahydrate) | 200 g |
| Sulfuric acid | 50 g |
| Sodium chloride | 0.1 g |
| Water | Balance (the total amount of the electrolytic plating solution was 1,000 mL) |

[Washing and Drying Process]

The plated film was observed with an electron microscope, and a grid-shaped metal pattern with line/space=14 μm/300 μm formed on the film base material was confirmed. Thus, a transparent auxiliary electrode film having a first auxiliary electrode constituted with a grid-shaped metal pattern.
[Formation of Second Auxiliary Electrode—Silver Nanowire Auxiliary Electrode—]

Preparation of Silver Nanowires

With reference to the method described in Adv. Mater., Vol. 14, (2002), p. 833 to 837, particles were formed using ethylene glycol (EG) as a reducing agent and polyvinyl pyrrolidone (PVP: average molecular mass of 40,000) as a morphological control agent and protective colloid agent, by separately performing a nucleation step and particle growing step, to thereby prepare a silver nanowire dispersion.

(Nucleation Step)

In a reaction vessel, to 100 mL of an EG solution was maintained at 160° C. while stirring, 10 mL of an EG solution of silver nitrate (concentration of silver nitrate: $1.5 \times 10^{-4}$ mol/L) was added at a predetermined flow rate for 10 seconds. Subsequently, silver ions were reduced while the mixed solution was maintained at 160° C. for 5 minutes, to thereby form silver core particles. The reaction solution had a yellow color, which was attributed from surface plasmon absorption of silver nano particles. This indicated that silver ions were reduced to thereby form silver fine particles (core particles).
(Particle Growing Step)

The reaction liquid containing the core particles after the completion of the nucleation step was maintained at 170° C. while stirring, and 200 mL of an EG solution of silver nitrate (concentration of silver nitrate: $1.0 \times 10^{-1}$ mol/L) and 200 mL of an EG solution of PVP (concentration conversion of vinyl pyrrolidone: $6.0 \times 10^{-1}$ mol/L) were added to the reaction liquid by a double jet method at a predetermined flow rate for 210 minutes. In the particle growing step, the reaction liquid was taken out every 30 minutes, and observed with an electron microscope. The core particles formed in the nucleation step were grown to wire-shaped particles with time, and formation of new fine particles in the particle growing step could not be observed. The electron micrograph of the resultant silver nanowires was taken, and the major axis lengths and minor axis lengths of 300 silver nanowires were measured, and then arithmetic means thereof were obtained. The silver nanowires had an average major axis length of 100 nm, and an average major axis length of 21 μm.
(Desalting and Washing Step)

The reaction liquid after the completion of the particle growing step was cooled to room temperature, and desalted and washed with water using an ultrafiltration film (molecular cutoff: 0.2 μm), and the solvent was replaced with ethanol. Finally, the liquid was condensed to 100 mL, to thereby prepare a silver nanowire dispersed ethanol solution.
[Coating]

To the transparent auxiliary electrode film having the first auxiliary electrode, the silver nanowire-dispersed ethanol solution was applied using a spin coater, so that the coated amount became 0.25 g/m², and dried to form a silver nanowire layer, followed by calender processing. Next, a methyl isobutyl ketone solution of urethane acrylate was applied to the silver nanowire layer using a spin coater, and dried. The thickness of the urethane acrylate layer was adjusted so that the silver nanowire layer was not completely embedded in the urethane acrylate layer, but part of the silver nanowire layer was exposed, and that the silver nanowire layer could be fixed on a film base material.

The film, on which the silver nanowire layer and the urethane acrylate layer were formed, was observed with an electron microscope, and it was confirmed that a network of the silver nanowires serving as the second auxiliary electrode was formed on the film base material and openings of grid-shaped metal pattern serving as the first auxiliary electrode.

As described above, a transparent auxiliary electrode film (Sample No. 224) having the first auxiliary electrode constituted with the grid-shaped metal pattern and the second auxiliary electrode constituted with the silver nanowire network was produced.

Sample Nos. 201 to 224 prepared as described above were evaluated by the following method. The results are shown in Table 1.
<Conductivity 1>

The surface resistance of each resultant sample was measured with LORESTA-GP MCP-T600 (manufactured by Mitsubishi Chemical Corporation).

<Conductivity 2>

The surface resistance of mesh opening of each resultant sample was measured with DIGITAL MULTIMETER 7555 (product name, manufactured by Yokogawa Electric Corporation).

<Transmittance>

The total light transmittance (%) of each resultant sample was measured using HAZE-GARD PLUS (manufactured by Gardner).

<Haze>

The haze of each resultant sample was measured using HAZE-GARD PLUS (manufactured by Gardner).

<Adhesion>

Each resultant sample was evaluated by a grid pattern cutting test (cross-cut test). Specifically, the sample was evaluated based on the number of remaining grid patterns out of 100 grid patterns in a 1 mm square area after peeling a tape.

The evaluation criteria of the adhesion are as follows. The larger the number is, the better the adhesion is.

[Evaluation Criteria]

1. The number of remaining grid pattern was less than 30, separation outstandingly occurred, and it was problematic in practical use.
2. The number of remaining grid pattern was 30 or more to less than 50, separation was observed, and it was problematic in practical use.
3. The number of remaining grid pattern was 50 or more to less than 70, separation was slightly observed, and it was not problematic in practical use.
4. The number of remaining grid pattern was 70 or more to less than 90, separation was hardly observed, and it was not problematic in practical use.
5. The number of remaining grid pattern was 90 or more, separation was not substantially observed, and it was not problematic in practical use.

<Flexibility>

A surface of each resultant sample, on which a conductive layer was formed, was faced outward, and then the sample was wound around a metal bar having a diameter of 9 mm, and left standing for 15 seconds. The surface resistances of the mesh openings of the sample before and after the sample was wound were measured with DIGITAL MULTIMETER 7555 (product name, manufactured by Yokogawa Electric Corporation). The variation in the surface resistance was obtained by the following equation and evaluated based on the following criteria. Note that the larger the number is, the better the flexibility is.

Resistance variation (%)=(after being wound)/(before being wound)×(100%)

[Evaluation Criteria]

1. Resistance variation was 300% or more, and problematic in practical use.
2. Resistance variation was 150% or more to less than 300%, and problematic in practical use.
3. Resistance variation was 130% or more to less than 150%, and no problematic in practical use.
4. Resistance variation was 115% or more to less than 130%, and no problematic in practical use.
5. Resistance variation was less than 115%, and no problematic in practical use.

TABLE 1

| Sample No. | Conductivity 1 Ω/square | Conductivity 2 Ω/square | Transmittance (%) | Haze (%) | Adhesion | Flexibility | Remarks |
| --- | --- | --- | --- | --- | --- | --- | --- |
| 201 | 10 | >$10^7$ | 84.0 | 4.1 | 4 | 3 | Com. Ex |
| 202 | 4.4 | 110 | 83.9 | 4.3 | 5 | 5 | Present Invention |
| 203 | 8.4 | 142,000 | 84.0 | 4.0 | 4 | 4 | Present Invention |
| 204 | 8.0 | 2,400 | 83.8 | 4.1 | 4 | 5 | Present Invention |
| 205 | 4.1 | 56 | 80.0 | 6.5 | 5 | 4 | Present Invention |
| 206 | 3.4 | 48 | 78.0 | 7.8 | 4 | 4 | Present Invention |
| 207 | 5.6 | 120 | 83.7 | 4.2 | 5 | 5 | Present Invention |
| 208 | 8.3 | 96,000 | 83.9 | 4.1 | 4 | 3 | Com. Ex |
| 209 | 7.8 | 1,740 | 83.8 | 4.2 | 4 | 4 | Present Invention |
| 210 | 4.2 | 65 | 80.1 | 7.0 | 4 | 4 | Present Invention |
| 211 | 3.6 | 44 | 77.8 | 8.8 | 3 | 3 | Com. Ex |
| 212 | 6.6 | 124 | 83.6 | 4.3 | 4 | 5 | Present Invention |
| 213 | 7.1 | 160 | 83.1 | 5.1 | 5 | 4 | Present Invention |
| 214 | 8.8 | 102 | 78.0 | 7.4 | 3 | 4 | Present Invention |
| 215 | 8.1 | 2,200 | 79.1 | 4.1 | 4 | 5 | Present Invention |
| 216 | 218 | 144 | 87.0 | 3.2 | 3 | 4 | Com. Ex |
| 217 | 42 | 136 | 86.4 | 3.8 | 4 | 4 | Present Invention |
| 218 | 3.3 | 135 | 73.0 | 9.8 | 4 | 4 | Present Invention |
| 219 | 2.5 | 132 | 64.4 | 12 | 4 | 3 | Com. Ex |
| 220 | 7.4 | 132 | 78.9 | 4.4 | 4 | 3 | Present Invention |
| 221 | 10 | 1,400 | 79.1 | 7.2 | 1 | 4 | Com. Ex |

TABLE 1-continued

| Sample No. | Conductivity 1 Ω/square | Conductivity 2 Ω/square | Transmittance (%) | Haze (%) | Adhesion | Flexibility | Remarks |
|---|---|---|---|---|---|---|---|
| 222 | 9.8 | 174 | 79.0 | 4.3 | 3 | 1 | Com. Ex |
| 223 | 4.1 | 108 | 83.9 | 4.1 | 5 | 5 | Present Invention |
| 224 | 380 | 79 | 85.1 | 3.7 | 4 | 1 | Com. Ex |

As seen from the results of Table 1, the conductive film of the present invention had excellent conductivity, transparency, adhesion to the coating layer, and flexibility. Moreover, the conductive film exhibited the outstanding effect particularly when it was formed by coating once, and the silver nanowires were used in combination. This was revealed for the first time by the present invention, and was a significant effect which could not be estimated.

The evaluation result of Sample No. 207 was excellent, but in the case where the coating solution was applied sequentially, the conductivity was poor. This might be caused by decrease in the conduction between the undercoating layer and the conductive layer.

The evaluation result of Sample No. 215 was basically good, even though the single wall carbon nanotubes were used. However, Sample No. 215 was inferior in the transparency and the conductivity of the mesh opening to the sample using the silver nanowire dispersion.

Sample Nos. 221 and 222, in each of which the conductive layer was formed using the conductive oxide fine particles by sputtering, could not satisfy all of the conductivity, transparency, adhesion to the undercoating layer, and flexibility as good as Examples of the present invention.

(Production of Electroluminescent Element)

Sample Nos. 201, 207, 221 and 222 produced as described above were each integrated into a dispersion-type inorganic electroluminescent (EL) element to make a light emission test as described below.

A coating solution for a reflective insulating layer containing a pigment having an average particle diameter of 0.03 µm and a coating solution for a light emitting layer containing fluorescent particles having a diameter of 50 µm to 60 µm were applied onto an aluminum sheet which would be a backside electrode, and then dried using a hot wind drier at 110° C. for 1 hour. Thereafter, each of Sample Nos. 201, 207, 221 and 222 was stacked onto the surface of the light emitting layer, and then thermally compressed to form an EL element. The element was sandwiched between two water-absorbing sheets made of nylon 6 and two moisture-proof films, and then these were thermally compressed. The EL element was 3 cm×5 cm in size.

(Evaluation)

As a power source used to measure the light-emitting luminance, a constant-frequency constant-voltage power source CVFT-D series (product name, manufactured by Tokyo Seiden Co., Ltd.) was used. For the measurement of the luminance, a luminance meter BM-9 (product name, manufactured by Topcon Technohouse Corp.) was used.

(Results)

The inorganic EL elements obtained at a peak voltage of 100V, and frequencies of 1,000 Hz and 2,000 Hz were driven, and luminances thereof were measured. The results are shown in Table 2.

TABLE 2

| Sample No. | Luminance (1 KHz) | Luminance (2 KHz) |
|---|---|---|
| 201 | 152 | 238 |
| 207 | 162 | 265 |
| 221 | 150 | 233 |
| 222 | 153 | 236 |

As seen from the results of Table 2, the luminance of the conductive film of the present invention improved owing to the luminescence of the mesh openings. However, as to Sample No. 221, in which the conductive oxide fine particles were added, probably because the aggregation and surface irregularities of the particles might occur, the resistance value less decreased, and the luminescence could not be improved. With regard to Sample No. 222, in which the conductive oxide layer was formed by sputtering, the luminance could not be improved, because the mesh region and opening region were not uniformly sputtered, and the surface was degraded in the following step, such as laminating.

(Production of Touch Panel)

In the case where the conductive material of the present invention was used as a transparent conductive film of a touch panel, the conductivity and the flexibility of the mesh openings improved. Consequently, information such as characters can be continuously input using a pen, thus the touch panel was excellent in linearity and durability.

Production of Sample No. 301 to 303

Production of Display Element

—Sample No. 301—

A display element was produced using the photosensitive composition of the present invention in the following manner.

First, a bottom gate-type TFT was formed on a glass substrate, and an insulative film of $Si_3N_4$ was formed so as to cover the TFT. Next, contact holes were formed in the insulative film, and wirings (height: 1.0 µm) connected through the contact holes to the TFT were formed on the insulative film.

Subsequently, in order to planarize irregularities caused as a result of formation of the wirings, a planarizing layer was formed on the insulative layer so as to embed the irregularities. Then, contact holes were formed therein to obtain planarizing film A.

Next, onto the planarizing film A, Sample No. 207, on which a pattern was formed corresponding to the contact holes, was bonded, to thereby obtain TFT-A (Sample No. 301). The operation of the TFT was found to be good.

—Sample Nos. 302 to 303—

Sample Nos. 302 and 303 were respectively obtained in the same manner as in the production of Sample No. 301, except that Sample Nos. 221 and 222 were respectively used instead of Sample No. 207.

In Sample No. 302, the operation of the TFT was confirmed similarly, but the TFT was found to be inferior in transparency to that using Sample No. 301. The diagonal uneven interference was observed in Sample No. 303, and it was judged a being problematic in practical use as a display element.

Production of Sample Nos. 401 to 403

Production of Integrated Solar Battery

—Sample No. 401—
—Production of Amorphous Solar Battery (Super Straight Type)—
An undercoating layer and a silver halide emulsion layer were formed on a glass substrate in the same manner as in preparation of Sample No. 107, and a conductive layer was formed thereon using a composition for a conductive layer, followed by exposing and developing, to thereby form a conductive film over the glass substrate. Through plasma-enhanced chemical vapor deposition (PECVD), on the glass substrate, on which the conductive film was formed, a p-type amorphous silicon film having a thickness of about 15 nm, an i-type amorphous silicon film having a thickness of about 350 nm, and an n-type amorphous silicon film having a thickness of about 30 nm. As a backside reflecting electrode, a gallium-doped zinc oxide layer having a thickness of 20 nm and a silver layer having a thickness of 200 nm were formed, to thereby produce a photoelectric conversion element 401 (Sample No. 401).
—Sample No. 402—
On a glass substrate a conductive film was formed in the same manner as in Sample No. 221, except that the calender process was not performed, and p-type, i-type and n-type amorphous silicon films, a zinc oxide layer and a silver layer were further formed thereon in the same manner as in Sample No. 401, to thereby produce a photoelectric conversion element 402 (Sample No. 402).
—Sample No. 403—
On a glass substrate an undercoating layer and a silver halide emulsion layer were formed, and a conductive layer was formed using a composition for the conductive layer in the same manner as in preparation of Sample No. 101, and a conductive film was formed thereon, and then an oxide conductive layer was formed by sputtering in the same manner as in Sample No. 222, and thereafter, a photoelectric conversion element was produced in the same manner as in the photoelectric conversion element 401, to thereby produce a photoelectric conversion element 403 (Sample No. 403).

Production of Sample Nos. 501 to 503

Production of CIGS Solar Battery (Substrate Type)

—Sample No. 501—
On a soda-lime glass substrate, a molybdenum electrode having a film thickness of about 500 nm was formed by DC magnetron sputtering, a $Cu(In_{0.6}Ga_{0.4})Se_2$ thin film, which was a chalcopyrite semiconductor material film, having a film thickness of about 2.5 μm was formed thereon by vapor deposition, a cadmium sulfide thin film having a film thickness of about 50 nm was formed thereon by solution deposition, a zinc oxide thin film having a film thickness of about 50 nm was formed thereon by MOCVD, and in the same manner as in Sample No. 107 an undercoating layer and a silver halide emulsion layer were formed thereon, and a conducive layer was further formed thereon using a composition for the conductive layer, followed by exposing and developing, to thereby form a conductive film over the soda-lime glass substrate. Thus, a photoelectric conversion element 501 (Sample No. 501) was produced.
—Sample No. 502—
On a soda-lime glass substrate, a molybdenum electrode, a $Cu(In_{0.6}Ga_{0.4})Se_2$ thin film, a cadmium sulfide thin film, and a zinc oxide thin film were formed in the same manner as in Sample No. 501, and a conductive film was formed on the zinc oxide thin film in the same manner as in Sample No. 221, except that the calender process was not performed, to thereby produce a photoelectric conversion element 502 (Sample No. 502).
—Sample No. 503—
On a soda-lime glass substrate, a molybdenum electrode, a $Cu(In_{0.6}Ga_{0.4})Se_2$ thin film, a cadmium sulfide thin film, and a zinc oxide thin film were formed in the same manner as in Sample No. 501, and an undercoating layer and a silver halide emulsion layer were formed on the zinc oxide thin film in the same manner as in Sample No. 101, and a conductive layer was formed thereon using a composition for the conductive layer by exposing and developing, and an oxide conductive layer was formed on the conductive layer by sputtering in the same manner as in Sample No. 222, to thereby produce a photoelectric conversion element 503 (Sample No. 503).

Next, each of the thus produced solar batteries was evaluated in terms of conversion efficiency in the following manner. The results are shown in Table 3.

<Evaluation of Solar Battery Properties (Conversion Efficiency)>
Each solar battery was irradiated with simulated sunlight (AM 1.5, 100 mW/cm$^2$) from a solar simulator, to thereby measure its solar battery properties (conversion efficiency).

TABLE 3

| Sample No. | Conversion Efficiency (%) |
|---|---|
| 401 | 8 |
| 402 | 6 |
| 403 | 6 |
| 501 | 8 |
| 502 | 7 |
| 503 | 7 |

As seen from the results of Table 3, by using the conductive material of the present invention in a solar battery, high conversion efficiency could be obtained in any solar battery system. Although the difference between the present invention and Comparative Examples in conversion efficiency was 1% to 2%, the difference was significant as well known in this art.

The photosensitive material for forming a conductive film of the present invention can be appropriately used in the conductive material of the present invention, and since the conductive material has high transparency and high conductivity, and excellent storage stability, the conductive film can be applied widely to various devices, such as organic EL elements, multilayer boards such as IC substrates, formation of transparent conductive films, circuit boards of printed-wiring boards, via-hole filling, adhesives for mounting components; formation of fine circuit patterns on multilayer wiring boards such as build-up wiring boards, plastic wiring boards, printed wiring boards, ceramic wiring boards, formation of fine pores for conduction in a direction connecting front and back surfaces of wiring boards, and various devices such as solar batteries formed on substrates.

What is claimed is:

1. A photosensitive material for forming a conductive film comprising:
   a silver salt-containing emulsion layer; and
   a conductive layer containing conductive fibers,
   wherein the amount of the conductive fibers in the conductive layer is 0.005 $g/m^2$ to 0.2 $g/m^2$.

2. The photosensitive material for forming a conductive film according to claim 1, wherein the amount of the silver salt in the silver salt-containing emulsion layer is 1.0 $g/m^2$ to 7.5 $g/m^2$ based on silver.

3. The photosensitive material for forming a conductive film according to claim 1, wherein a material for forming the conductive fibers is any one of a metal and carbon.

4. The photosensitive material for forming a conductive film according to claim 1, wherein the silver salt-containing emulsion layer and the conductive layer are formed by simultaneously applying coating solutions thereof.

5. The photosensitive material for forming a conductive film according to claim 1, wherein the conductive fibers are metal nanowires each having a minor axis length of 8 nm to 50 nm, and a major axis length of 1 μm to 40 μm.

6. The photosensitive material for forming a conductive film according to claim 5, wherein the metal nanowires are each formed of silver or a mixture of silver and one or more metals other than the silver.

7. The photosensitive material for forming a conductive film according to claim 1, wherein the conductive fibers are carbon nanotubes each having a minor axis length of 1 nm to 1,000 nm, and a major axis length of 0.1 μm to 1,000 μm.

8. A conductive material, comprising:
   a patterned photosensitive material for forming a conductive film, obtained by exposing a photosensitive material patternwise and developing the exposed photosensitive material,
   wherein the photosensitive material for forming a conductive film comprises a silver salt-containing emulsion layer, and a conductive layer containing conductive fibers, and
   wherein the amount of the conductive fibers in the conductive layer is 0.005 $g/m^2$ to 0.2 $g/m^2$.

9. The conductive material according to claim 8, wherein the amount of the silver salt in the silver salt-containing emulsion layer is 1.0 $g/m^2$ to 7.5 $g/m^2$ based on silver.

10. The conductive material according to claim 8, further comprising metal silver.

11. The conductive material according to claim 8, wherein a material for forming the conductive fibers is any one of a metal and carbon.

12. The conductive material according to claim 8, wherein the silver salt-containing emulsion layer and the conductive layer are formed by simultaneously applying coating solutions thereof.

13. The conductive material according to claim 8, wherein the conductive fibers are metal nanowires each having a minor axis length of 8 nm to 50 nm and a major axis length of 1 μm to 40 μm.

14. The conductive material according to claim 13, wherein the metal nanowires are each formed of silver or a mixture of silver and one or more metals other than the silver.

15. The conductive material according to claim 8, wherein the conductive fibers are carbon nanotubes each having a minor axis length of 1 nm to 1,000 nm and a major axis length of 0.1 μm to 1,000 μm.

* * * * *